(12) United States Patent
Ohse et al.

(10) Patent No.: US 11,309,438 B2
(45) Date of Patent: Apr. 19, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Naoyuki Ohse, Matsumoto (JP); Takahito Kojima, Matsumoto (JP); Yuichi Hashizume, Matsumoto (JP); Takafumi Uchida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/108,591

(22) Filed: Dec. 1, 2020

(65) Prior Publication Data

US 2021/0175369 A1    Jun. 10, 2021

(30) Foreign Application Priority Data

Dec. 10, 2019 (JP) .............................. JP2019-223281
Oct. 28, 2020 (JP) .............................. JP2020-180897

(51) Int. Cl.
*H01L 29/872* (2006.01)
*H01L 21/04* (2006.01)
(Continued)

(52) U.S. Cl.
CPC ........ *H01L 29/872* (2013.01); *H01L 21/0485* (2013.01); *H01L 21/0495* (2013.01);
(Continued)

(58) Field of Classification Search
CPC ..... H01L 29/16; H01L 29/16; H01L 29/1608; H01L 29/45; H01L 29/47; H01L 29/66;
(Continued)

(56) References Cited

U.S. PATENT DOCUMENTS 9,741,798 B2 * 8/2017 Shimizu ................ H01L 29/517
2008/0277668 A1   11/2008 Okuno et al.
(Continued)

FOREIGN PATENT DOCUMENTS

JP   H1-020616 A   1/1998
JP   2003-158259 A   5/2003
(Continued)

OTHER PUBLICATIONS

N. Kiritani et al., "Single Material Ohmic Contacts Simultaneously Formed on the Source/P-well/Gate of 4H-SiC Vertical MOSFETs," Materials Science Forum, Switzerland, Trans Tech Publications, 2003, vol. 433—vol. 436, pp. 669-672.

*Primary Examiner* — Monica D Harrison
(74) *Attorney, Agent, or Firm* — Rabin & Berdo, P.C.

(57) ABSTRACT

A semiconductor device having, in a plan view, a termination region surrounding an active region. The semiconductor device includes a semiconductor substrate containing silicon carbide, a first-conductivity-type region provided in the semiconductor substrate at its first main surface, a plurality of first second-conductivity-type regions selectively formed in the semiconductor substrate at its first main surface, a plurality of silicide films respectively in ohmic contact with the first second-conductivity-type regions, a first electrode that is in contact with the silicide films to form ohmic regions, with the first second-conductivity-type regions to form non-operating regions, and with the first-conductivity-type region to form Schottky regions, a second electrode provided at a second main surface of the semiconductor substrate, and a second second-conductivity-type region provided in the termination region. The ohmic regions, the non-operating regions and the Schottky regions are formed in the active region in a striped pattern. The second second-
(Continued)

conductivity-type region connects the ohmic regions and the non-operating regions.

8 Claims, 22 Drawing Sheets

(51) Int. Cl.
    *H01L 29/16*     (2006.01)
    *H01L 29/45*     (2006.01)
    *H01L 29/66*     (2006.01)
    *H01L 29/47*     (2006.01)

(52) U.S. Cl.
    CPC .......... *H01L 29/1608* (2013.01); *H01L 29/45* (2013.01); *H01L 29/47* (2013.01); *H01L 29/6606* (2013.01)

(58) Field of Classification Search
    CPC ..... H01L 29/66; H01L 29/6606; H01L 29/87; H01L 29/872; H01L 21/04; H01L 21/048; H01L 21/0485; H01L 21/049; H01L 21/0495
    USPC .......................................................... 257/77
    See application file for complete search history.

(56) References Cited

U.S. PATENT DOCUMENTS

| 2010/0032730 A1 | 2/2010 | Endo et al. |
| 2010/0055858 A1 | 3/2010 | Hayashi et al. |
| 2017/0271472 A1 | 9/2017 | Ohse et al. |

FOREIGN PATENT DOCUMENTS

| JP | 2005-276978 A | 10/2005 |
| JP | 2008-282972 A | 11/2008 |
| JP | 4291875 B2 | 7/2009 |
| JP | 2013-120776 A | 6/2013 |
| JP | 5546759 B2 | 7/2014 |
| JP | 2017-175115 A | 9/2017 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application Nos. 2019-223281, filed on Dec. 10, 2019, and 2020-180897, filed on Oct. 28, 2020, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Recently, silicon carbide (SiC) semiconductors have gained attention as a semiconductor material that enables fabrication (manufacture) of semiconductor devices (hereinafter, silicon carbide semiconductor devices) that exceed the limitations of semiconductor devices that use a silicon (Si) semiconductor. In particular, as compared to a silicon semiconductor, a silicon carbide semiconductor has high dielectric breakdown field strength and high thermal conductivity; and due to such characteristics, application to high-voltage (for example, at least 1700V) semiconductor devices is expected.

When a silicon carbide semiconductor device is a diode (hereinafter, silicon carbide diode), it is possible to set a thin thickness and high impurity concentration as design specifications for an n$^-$-type epitaxial layer that forms an n$^-$-type drift region and therefore, a silicon carbide diode having a breakdown voltage up to about 3300V typically has a Schottky barrier diode (SBD) structure.

A structure of a conventional silicon carbide diode having an SBD structure will be described. FIG. 25 is a plan view of a conventional silicon carbide semiconductor device as viewed from a front side of a semiconductor substrate. A conventional silicon carbide semiconductor device 140 depicted in FIG. 25 is a vertical silicon carbide diode having a SBD structure in which a Schottky junction is formed along a front surface of the semiconductor substrate 130 in an entire area of a front surface of a semiconductor substrate 130 containing silicon carbide, in an active region 110.

The Schottky junction of the conventional silicon carbide semiconductor device 140 is formed by an n$^-$-type drift region 112 exposed at the front surface of a semiconductor substrate 130 and a front electrode (not depicted) configured by a metal layer provided on the front surface of the semiconductor substrate 130. Reference numerals 120, 121 are an edge termination region and a field limiting ring (FLR), respectively.

Usually, in a SBD structure, electric field strength at bonded surfaces of the semiconductor substrate 130 and the front electrode is high and when reverse voltage is applied, a problem arises in that reverse leak current increases due to the tunneling of electrons in the Schottky barrier or reverse leak current increases due to surface characteristics particular to silicon carbide. Therefore, a silicon carbide diode has been proposed that adopts a junction barrier Schottky (JBS) structure that has both Schottky junctions and pn junctions at a front side of the semiconductor substrate 130.

A structure of a conventional silicon carbide diode having JBS structures will be described. FIG. 26 is a plan view of another example of a conventional silicon carbide semiconductor device, as viewed from a front side of a semiconductor substrate. In FIG. 26, a voltage withstanding structure, etc. in an edge termination region and a front electrode 114, a field oxide film 115, etc. on a front surface of a semiconductor substrate 130 are not depicted. FIG. 27 is a cross-sectional view of the structure along cutting line AA-AA' in FIG. 26. Reference numeral 119 is a back electrode.

A conventional silicon carbide semiconductor device 140' depicted in FIGS. 26 and 27 differs from the conventional silicon carbide semiconductor device 140 depicted in FIG. 25 in that in the active region 110, a SBD structure formed by Schottky junctions between the n$^-$-type drift region 112 and a titanium film 131 constituting the front electrode 114, and JBS structures formed by pn junctions between p-type regions 113 and the n$^-$-type drift region 112 are both present at the front side of the semiconductor substrate 130.

The p-type regions 113 are selectively provided in surface regions of the front surface of the semiconductor substrate 130, in the active region 110. Between adjacent p-type regions 113 of the p-type regions 113, the n$^-$-type drift region 112 is exposed at the front surface of the semiconductor substrate 130. The pn junctions are formed at the front surface of the semiconductor substrate 130 by the p-type regions 113 and the n$^-$-type drift region 112. Between adjacent p-type regions 113 of the p-type regions 113, the n$^-$-type drift region 112 forms Schottky junctions with the titanium film 131 that is a lowermost layer of the front electrode 114 provided on the front surface of the semiconductor substrate 130.

In this manner, the JBS structures have a mixture of the pn junctions and the Schottky junctions at the bonded surfaces between the semiconductor substrate 130 and the front electrode 114, whereby the electric field strength at the bonded surfaces of the semiconductor substrate 130 and the front electrode 114 may be reduced and therefore, suppression of leak current to an extent of that of a free wheeling diode (FWD) that uses a silicon semiconductor becomes possible. In FIG. 26, the p-type regions 113 disposed in a striped pattern extending along a direction parallel to the front surface of the semiconductor substrate 130 are indicated by hatching.

Further, in the conventional silicon carbide semiconductor device 140 depicted in FIG. 25, during surge voltage application, surge current is generated in the semiconductor substrate 130 and flows in a forward direction, and a small amount (hereinafter, pulled amount) of this surge current is pulled from inside the semiconductor substrate 130 out to the front electrode 114. A reason for this is that the diode of the SBD structure is a unipolar device that does not use minority carriers for electrical conduction and in a high-current region of the diode where high forward current passes, a contact (electrical contact) between the semiconductor substrate 130 and the front electrode 114 has high resistance.

When the contact between the semiconductor substrate 130 and the front electrode 114 has high resistance and high surge current flows in the forward direction in the semiconductor substrate, the surge current concentrates locally due to heat generated at an interface between the semiconductor substrate 130 and the front electrode 114. Due to this concentration of surge current, destruction occurs at the Schottky junction surface and the n⁻-type epitaxial layer (the n⁻-type drift region 112) directly beneath the Schottky junctions and therefore, the pulled amount of the surge current pulled from inside the semiconductor substrate 130 to the front electrode 114 decreases.

The pulled amount of the surge current has been confirmed to increase in a diode having JBS structures that use a silicon semiconductor. Therefore, in the conventional silicon carbide semiconductor device 140' depicted in FIG. 26 as well, similarly to a diode having JBS structures that use a silicon semiconductor, the pulled amount of the surge current was expected to be large due to the rising phenomenon of the surge current as a consequence of bipolar operation of pn junctions formed at the front surface of the semiconductor substrate 130 by the p-type regions 113 and the n⁻-type drift region 112, however, this effect did not noticeably appear.

As one factor for the pulled amount of the surge current of the conventional silicon carbide semiconductor device 140' depicted in FIG. 26 being small, it is conceivable that the resistance of the ohmic contact between the front electrode 114 and the p-type regions 113 constituting pn junction parts of the JBS structures was not low enough. Thus, surge current capability is assumed to be enhanced by forming, between the p-type regions 113 and the front electrode 114, metal electrodes (hereinafter, ohmic electrodes) in ohmic contact with the p-type regions 113, and by locally passing surge current in the pn junction parts of the JBS structures.

FIG. 28 is a cross-sectional view of another example of a conventional silicon carbide semiconductor device. FIG. 28 is FIG. 3 of Japanese Laid-Open Patent Publication No. 2008-282972. A conventional silicon carbide semiconductor device 150 depicted in FIG. 28 differs from the conventional silicon carbide semiconductor device 140' depicted in FIGS. 26 and 27 in that, as the lowermost layer of the front electrode 114, ohmic electrodes 133' are provided on the p-type regions 113 while Schottky junctions between the n⁻-type drift region 112 and a Schottky electrode 131', and ohmic contacts between the p-type regions 113 and the ohmic electrodes 133' are both present at the front surface of the semiconductor substrate 130.

As a method of manufacturing a conventional silicon carbide diode having JBS structures, a method has been proposed according to which a metal electrode (hereinafter, Schottky electrode) that forms Schottky junctions with an n⁻-type drift region is formed only on parts of the n⁻-type drift region exposed at a front surface of a semiconductor substrate and thereafter, on the front surface of the semiconductor substrate, ohmic electrodes in ohmic contact with p-type regions constituting pn junction parts of the JBS structures are formed so as to underlie the Schottky electrode (for example, refer to Japanese Patent No. 5546759).

Japanese Patent No. 5546759 discloses that aluminum (Al) or nickel (Ni) is used as a material of the ohmic electrodes, and molybdenum (Mo) is used as a material of the Schottky electrode. Further, Japanese Patent No. 5546759 discloses a silicon carbide diode in which in p-type regions constituting pn junction parts of the JBS structures, p⁺-type contact regions having an impurity concentration higher than that of the p-type regions are selectively formed, whereby an ohmic property between the p-type regions and ohmic electrodes is enhanced.

As another method of manufacturing a conventional silicon carbide diode having JBS structures, a method has been proposed according to which ohmic electrodes are formed only on p-type regions constituting pn junction parts of the JBS structures and thereafter, on a front surface of a semiconductor substrate, a Schottky electrode that forms Schottky junctions with an n⁻-type drift region is formed so as to cover the ohmic electrodes (for example, refer to Japanese Laid-Open Patent Publication No. 2008-282972). Japanese Laid-Open Patent Publication No. 2008-282972 discloses that aluminum is used as a material of the ohmic electrodes and molybdenum (Mo) is used as a material of the Schottky electrode.

Further, as another method of manufacturing a conventional silicon carbide diode having JBS structures, a method has been disclosed according to which Schottky junctions formed with an n⁻-type drift region, and a silicide (NiSi₂) film constituting an anode electrode in ohmic contact with p-type regions constituting pn junction parts of the JBS structures are formed by only a silicide reaction of a silicon film and a nickel film sequentially deposited on a semiconductor substrate containing silicon carbide, to have a stoichiometric ratio of 2:1 (=Si:Ni) (for example, refer to Japanese Laid-Open Patent Publication No. 2003-158259).

As a method of forming ohmic electrodes on p-type regions, a method has been proposed according to which, on a semiconductor substrate containing silicon carbide, an aluminum film and a nickel film are sequentially deposited so as to cover the p-type regions and thereafter, through annealing (heat treatment) at 1000 degrees C., silicon atoms in the semiconductor substrate and nickel atoms in the nickel film are caused to react and form a nickel silicide (NiSi) film that becomes the ohmic electrodes in ohmic contact with the p-type regions (for example, refer to N. Kiritani, et al, Single Material Ohmic Contacts Simultaneously Formed on the Source/P-well/Gate of 4H—SiC Vertical MOSFETs, Materials Science Forum, Switzerland, Trans Tech Publications, 2003, Vol. 433-Vol. 436, pp. 669-672).

As another method of forming ohmic electrodes on p-type regions, a method has been proposed according to which, on a semiconductor substrate containing silicon carbide, a nickel film and an aluminum film are sequentially deposited so as to cover the p-type regions and thereafter, these metal films and the semiconductor substrate are caused to react through a heat treatment at a temperature in a range from about 850 degrees C. to 1050 degrees C., thereby forming p-type ohmic electrodes from an alloy containing nickel, aluminum, silicon, and carbon (C) (for example, refer to Japanese Patent No. 4291875).

As another method of forming ohmic electrodes on pn p-type regions, a method has been proposed according to which, on a semiconductor substrate containing silicon carbide, an aluminum film and a silicon film are sequentially deposited so as to cover the p-type regions and have an elemental composition ratio of 89:11 (=Al:Si) and thereafter, an alloy film is formed from the aluminum film and the silicon film through a heat treatment at a temperature in a range from 400 degrees C. to 500 degrees C., whereby ohmic contacts between the alloy film and the p-type regions are formed (for example, refer to Japanese Laid-Open Patent Publication No. H1-020616).

As another method of forming ohmic electrodes, a method has been proposed according to which, on a semiconductor substrate containing silicon carbide, a nickel film is formed on high-concentration impurity regions formed by ion-implanting silicon atoms, a precursor layer of a heating reaction layer is formed only at interfaces between the nickel film and the high-concentration impurity regions through a heat treatment at a temperature in a range from 400 degrees C. to 600 degrees and thereafter, the precursor layer of the heating reaction layer is converted into a low-resistance heating reaction layer through a heat treatment at 950 degrees C. (for example, refer to Japanese Laid-Open Patent Publication No. 2017-175115).

As another method of forming ohmic electrodes, a method has been proposed according to which, in contact holes of an interlayer insulating film, a precursor layer of a heating reaction layer is formed between a semiconductor substrate containing silicon carbide and a metal material film by a heat treatment, and the precursor layer of the heating reaction layer is converted into the heating reaction layer by a heat treatment at a temperature higher than that of a first-stage heat treatment (for example, refer to Japanese Laid-Open Patent Publication No. 2005-276978). Japanese Laid-Open Patent Publication No. 2005-276978 discloses that a material of the metal material film is titanium aluminum or nickel, and the first-stage heat treatment is set to a low temperature that does not cause harmful solid-phase reactions between the metal material film and the interlayer insulating film.

Further, Japanese Laid-Open Patent Publication No. 2005-276978 discloses that the metal material film is formed so as to be in contact with an entire area of the surface of the semiconductor substrate in the contact holes of the interlayer insulating film, contact regions between the metal material film and the semiconductor substrate are converted into a silicide by a heat treatment, and in a silicide process of forming the heating reaction layer by self-alignment at an entire area of the contact regions, a part (part other than the heating reaction layer) of the metal material film not converted into a silicide is removed through etching, whereby only the part of the metal material film forming the heating reaction layer is left.

FIG. 29 is a cross-sectional view of an example of an ohmic electrode formed by self-alignment by the method of manufacturing the conventional silicon carbide semiconductor device. FIG. 29 is FIG. 1 of Japanese Laid-Open Patent Publication No. 2005-276978. A conventional silicon carbide semiconductor device 160 depicted in FIG. 29 includes, in a contact hole 163a of an interlayer insulating film 163, a heating reaction layer that forms an ohmic electrode 164 in contact with and electrically connecting a high-concentration impurity region 162 in a surface region of a semiconductor substrate 161 containing silicon carbide and a wiring layer 165 embedded in the contact hole 163a of the interlayer insulating film 163.

Through the silicide process recited in Japanese Laid-Open Patent Publication No. 2005-276978, the ohmic electrode 164 is formed by self-alignment in an entire area of the surface of the semiconductor substrate 161 in the contact hole 163a of the interlayer insulating film 163, using the interlayer insulating film 163 as a mask. The ohmic electrode 164 is provided in a surface region of the high-concentration impurity region 162 exposed at the surface of the semiconductor substrate 161, in the contact hole 163a of the interlayer insulating film 163 and protrudes from the front surface of the semiconductor substrate 161 in a direction away from the front surface of the semiconductor substrate 161.

As another method of forming ohmic electrodes, a method has been proposed according to which an electrode film is formed covering a surface on which a resist pattern is formed and thereafter, the resist pattern is lifted off, whereby p-type ohmic electrodes are formed having a gap between an oxide film and the electrode film formed inside a hole (for example, refer to Japanese Laid-Open Patent Publication No. 2013-120776).

SUMMARY OF THE INVENTION

According to an embodiment of the invention, a silicon carbide semiconductor device has, in a plan view thereof, an active region and a termination region surrounding a periphery of the active region, and the silicon carbide semiconductor device includes a semiconductor substrate containing silicon carbide and having a first main surface and a second main surface; a first-conductivity-type region provided in the semiconductor substrate, and exposed at the first main surface of the semiconductor substrate; a plurality of first second-conductivity-type regions selectively provided in the active region, the first second-conductivity-type regions being formed in the semiconductor substrate at the first main surface thereof and being in contact with the first-conductivity-type region; a plurality of silicide films respectively in ohmic contact with the plurality of first second-conductivity-type regions; a first electrode, which is in contact with the plurality of silicide films to form a plurality of ohmic regions, in contact with the plurality of first second-conductivity-type regions to form a plurality of non-operating regions, and in contact with the first-conductivity-type region to form a plurality of Schottky regions; a second electrode provided at the second main surface of the semiconductor substrate; and a second second-conductivity-type region provided in the termination region, surrounding the active region. The ohmic regions, the non-operating regions, and the Schottky regions are formed in the active region and are provided in a striped pattern, and the second second-conductivity-type region connects the ohmic regions and the non-operating regions in the termination region.

In the embodiment, the ohmic regions include a plurality of stripe-shaped regions separate from one another in the active region.

In the embodiment, a contact resistance of each ohmic region with a corresponding one of the silicide films and with the first electrode is at most $5.0 \times 10^{-3}$ $\Omega cm^2$.

In the embodiment, a contact resistance of each ohmic region with a corresponding one of the silicide films and with the first electrode is at most $5.0 \times 10^{-4}$ $\Omega cm^2$.

In the embodiment, each of the silicide films contains nickel, silicon, and aluminum.

In the embodiment, each of the ohmic regions and the Schottky regions are in contact with one of the non-operating regions.

In the embodiment, each of the ohmic regions has a width that is at most 2 μm.

According to another embodiment of the invention, a method of manufacturing a silicon carbide semiconductor device having, in a plan view thereof, an active region and a termination region surrounding a periphery of the active region, includes providing a semiconductor substrate containing silicon carbide, the semiconductor substrate having a first main surface and a second main surface; forming a first-conductivity-type region in the semiconductor substrate, a surface of the first-conductivity-type region forming the first main surface of the semiconductor substrate; selectively forming a plurality of first second-conductivity-type regions in the active region, the plurality of first second-conductivity-type regions being formed in the semiconductor substrate at the first main surface thereof, and being in contact with the first-conductivity-type region; forming a second second-conductivity-type region in the termination region, surrounding the active region; forming an oxide film on the first main surface of the semiconductor substrate, covering the first-conductivity-type region and the first second-conductivity-type regions; forming a plurality of openings in the oxide film, to thereby expose the first second-conductivity-type regions, by selectively removing the oxide film; forming a metal material film in the openings of the oxide film and in contact with first main surface of the semiconductor substrate, by sequentially stacking a first nickel film, an aluminum film, and a metal film having a melting point higher than that of aluminum; generating a compound layer on the first main surface of the semiconductor substrate through a first heat treatment that causes the metal material film and the semiconductor substrate to react, to thereby form the compound layer by self-alignment in the openings of the oxide film using the oxide film as a mask; removing an excess part of the metal material film excluding the compound layer; generating a nickel silicide in the compound layer to form a silicide film in ohmic contact with the semiconductor substrate, by a second heat treatment at a temperature higher than that of the first heat treatment; forming a contact hole connecting the openings by removing the oxide film in the active region; forming a first electrode on the first main surface of the semiconductor substrate in the contact hole, by sequentially stacking a titanium film and a metal electrode film containing aluminum, the first electrode being in contact with the first-conductivity-type region to form a plurality of Schottky regions, in contact with the silicide film to form a plurality of ohmic regions, and in contact with the first second-conductivity-type regions to form a plurality of non-operating regions; and forming a second electrode on the second main surface of the semiconductor substrate. Each of the openings is formed to have a width that is smaller than a width of each of the first second-conductivity-type regions. The ohmic regions, the non-operating regions, and the Schottky regions are in the active region and are formed in a striped pattern, and the second second-conductivity-type region is connected to ohmic regions and the non-operating regions in the termination region.

Objects, features, and advantages of the present invention are specifically set forth in or will become apparent from the following detailed description of the invention when read in conjunction with the accompanying drawings.

DETAILED DESCRIPTION OF THE INVENTION

Figure 26:
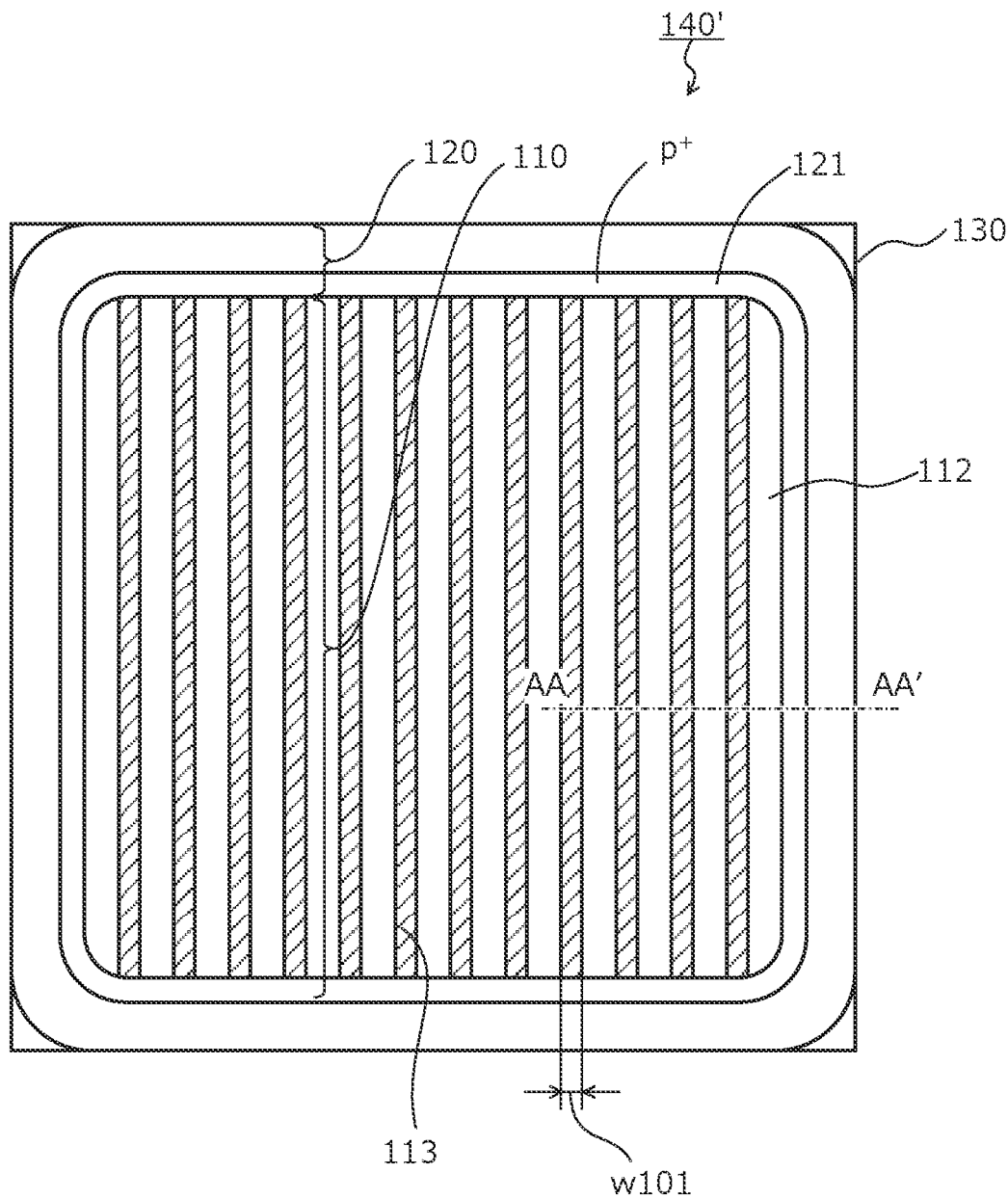
FIG. 26 is a plan view of another example of a conventional silicon carbide semiconductor device, as viewed from a front side of a semiconductor substrate.
Figure 27:
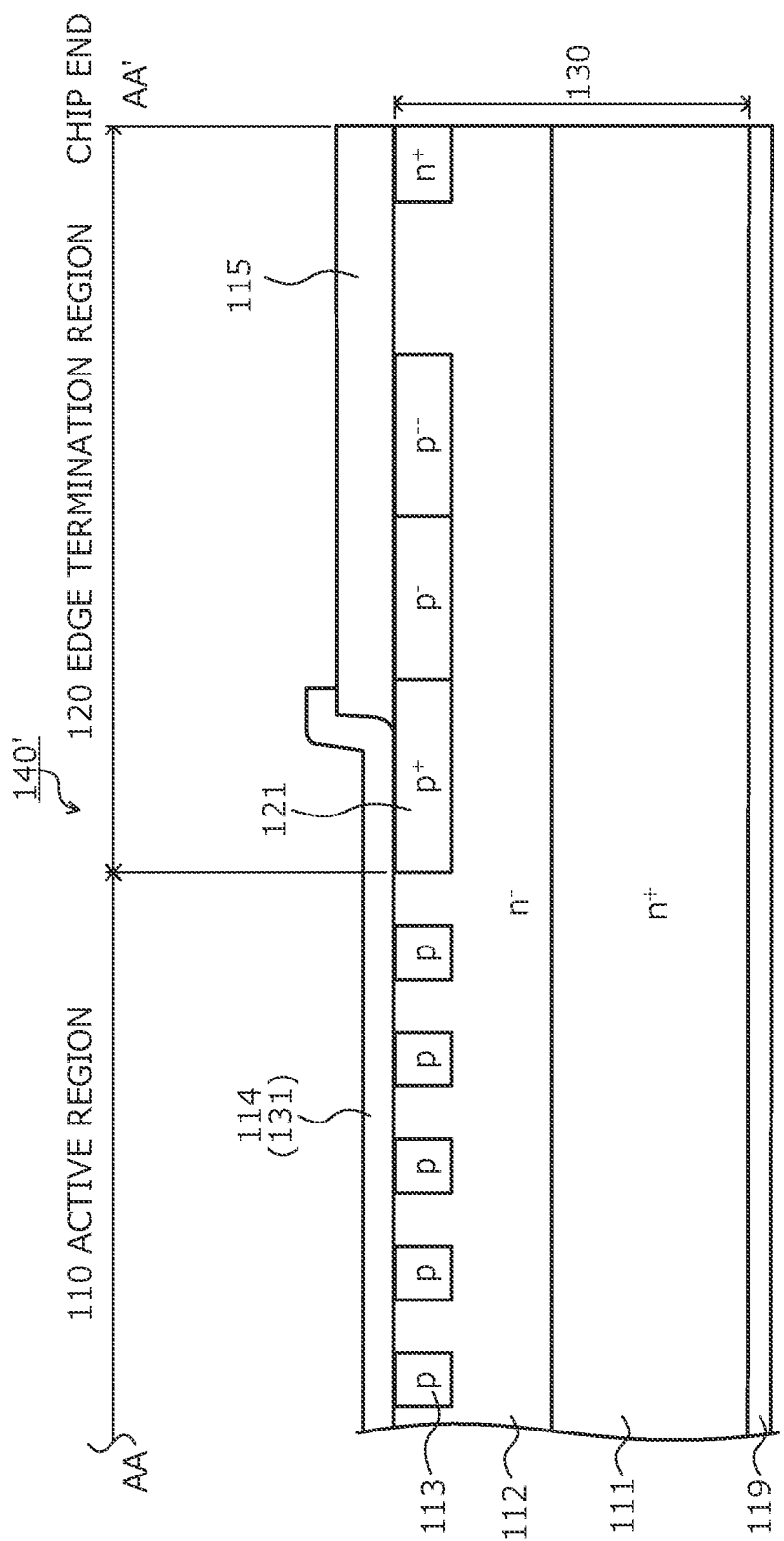
FIG. 27 is a cross-sectional view of a structure along cutting line AA-AA' in FIG. 26.
Figure 28:
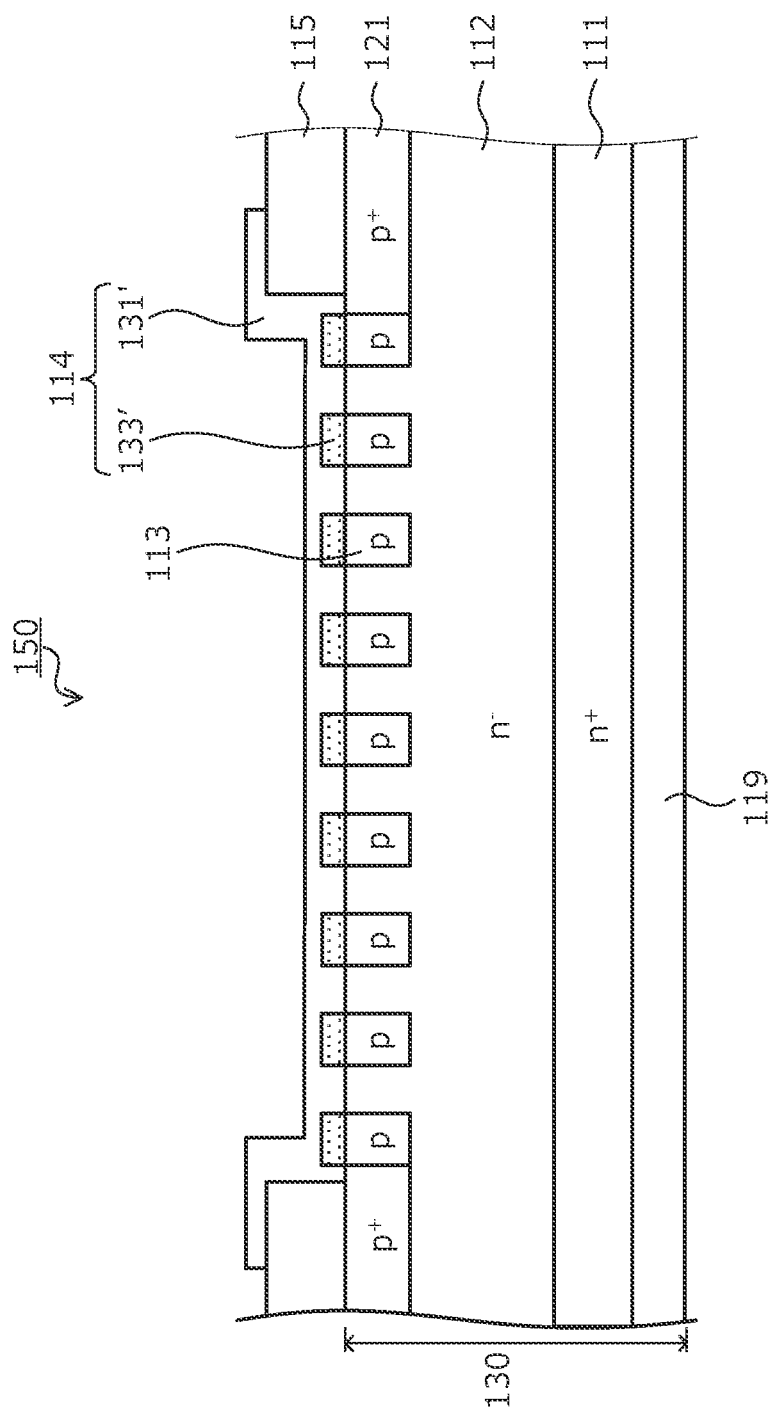
FIG. 28 is a cross-sectional view of another example of a conventional silicon carbide semiconductor device.
Figure 29:
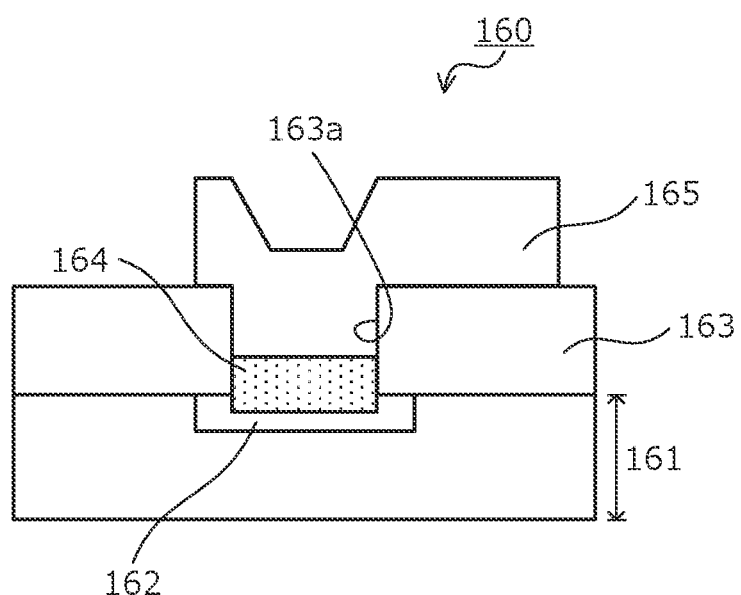
FIG. 29 is a cross-sectional view of an example of an ohmic electrode formed by self-alignment by a method of manufacturing the conventional silicon carbide semiconductor device.

First, problems associated with the conventional techniques will be discussed. To enhance the surge current capability of the conventional silicon carbide semiconductor device 140' (silicon carbide diode having JBS structures, refer to FIGS. 26 and 27) described above, even with the ohmic electrodes being in contact only with the p-type regions 113 between the semiconductor substrate 130 and the Schottky electrode (the titanium film 131), when the ohmic electrodes are a nickel silicide film, contact resistance between the p-type regions 113 and the ohmic electrodes cannot be sufficiently reduced and therefore, a predetermined design value of the surge current capability (IFSM) cannot be obtained.

When the contact area between the p-type regions 113 and the ohmic electrodes is increased to decrease the contact resistance between the p-type regions 113 and ohmic electrodes and the active region 110 is maintained to have the same surface area, the greater is the contact area between the p-type regions 113 and the ohmic electrodes, the smaller is the contact area between the n$^-$-type drift region 112 and the Schottky electrode. Therefore, during forward bias, electron current from the n$^-$-type drift region 112 to the Schottky electrode decreases and reduction of the forward voltage (Vf) is difficult. In this manner, when the ohmic electrodes are formed at the expense of the region of the Schottky electrode, while IFSM characteristics improve, Vf characteristics degrade, whereby the Vf characteristics and the IFSM characteristics have a tradeoff relationship.

Figure 30:
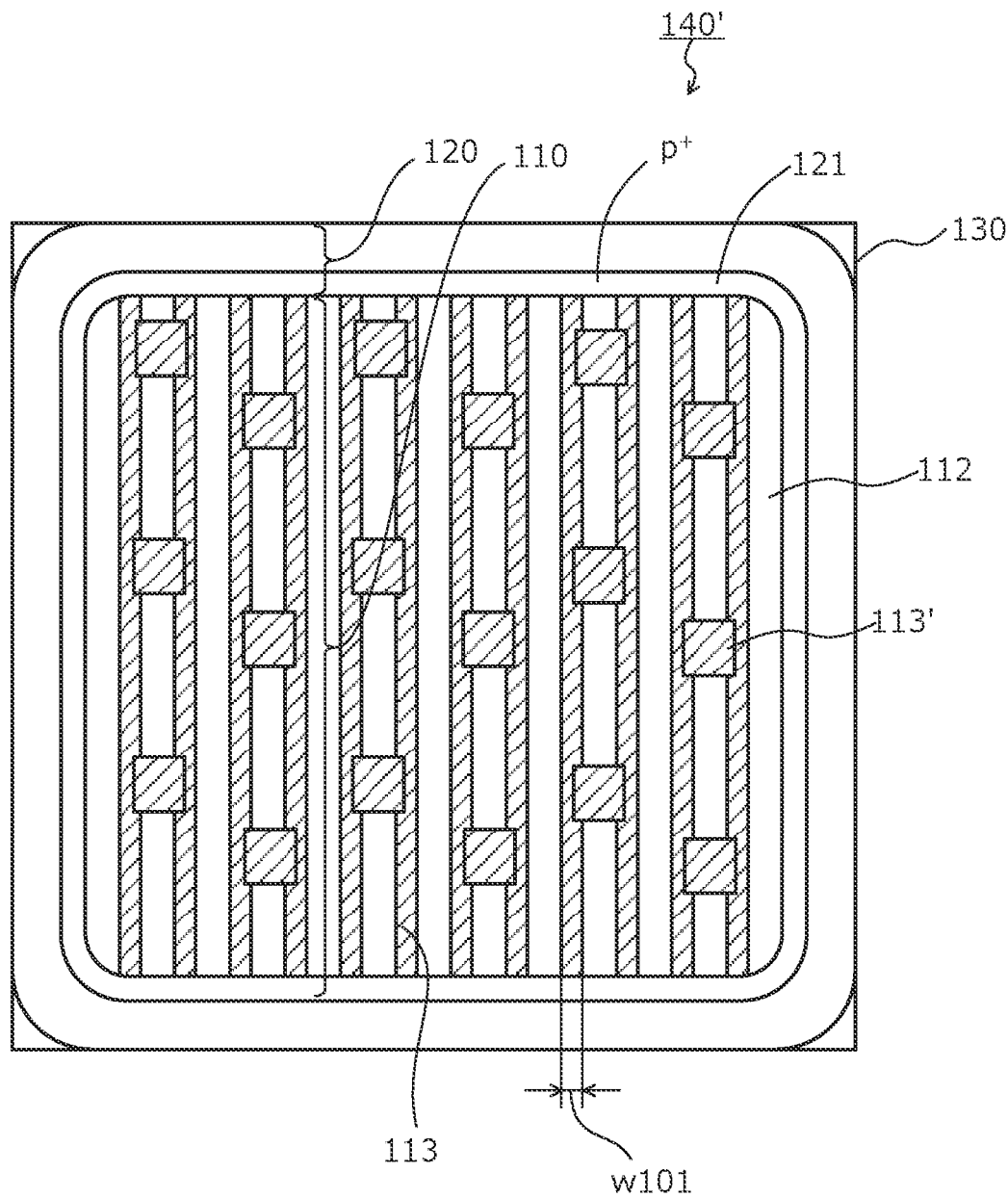
FIG. 30 is a plan view of the conventional silicon carbide semiconductor device for which an area of ohmic electrodes is increased, as viewed from a front side of a semiconductor substrate.

For instance, there is an example in which on the p-type regions 113, ohmic electrodes having an area greater than that of the Schottky electrode are formed and the IFSM characteristics are improved at the expense of the Vf characteristics decreasing. FIG. 30 is a plan view of the conventional silicon carbide semiconductor device for which the area of the ohmic electrodes is increased, as viewed from a front side of the semiconductor substrate. In FIG. 30, in addition to the ohmic electrodes formed on the p-type regions 113 provided in a striped pattern, ohmic electrodes are further formed on dot-shaped (rectangular-shaped) p-type regions 113' that connect the p-type regions 113. As a result, ohmic electrodes having an area greater than that of the Schottky electrode are formed.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
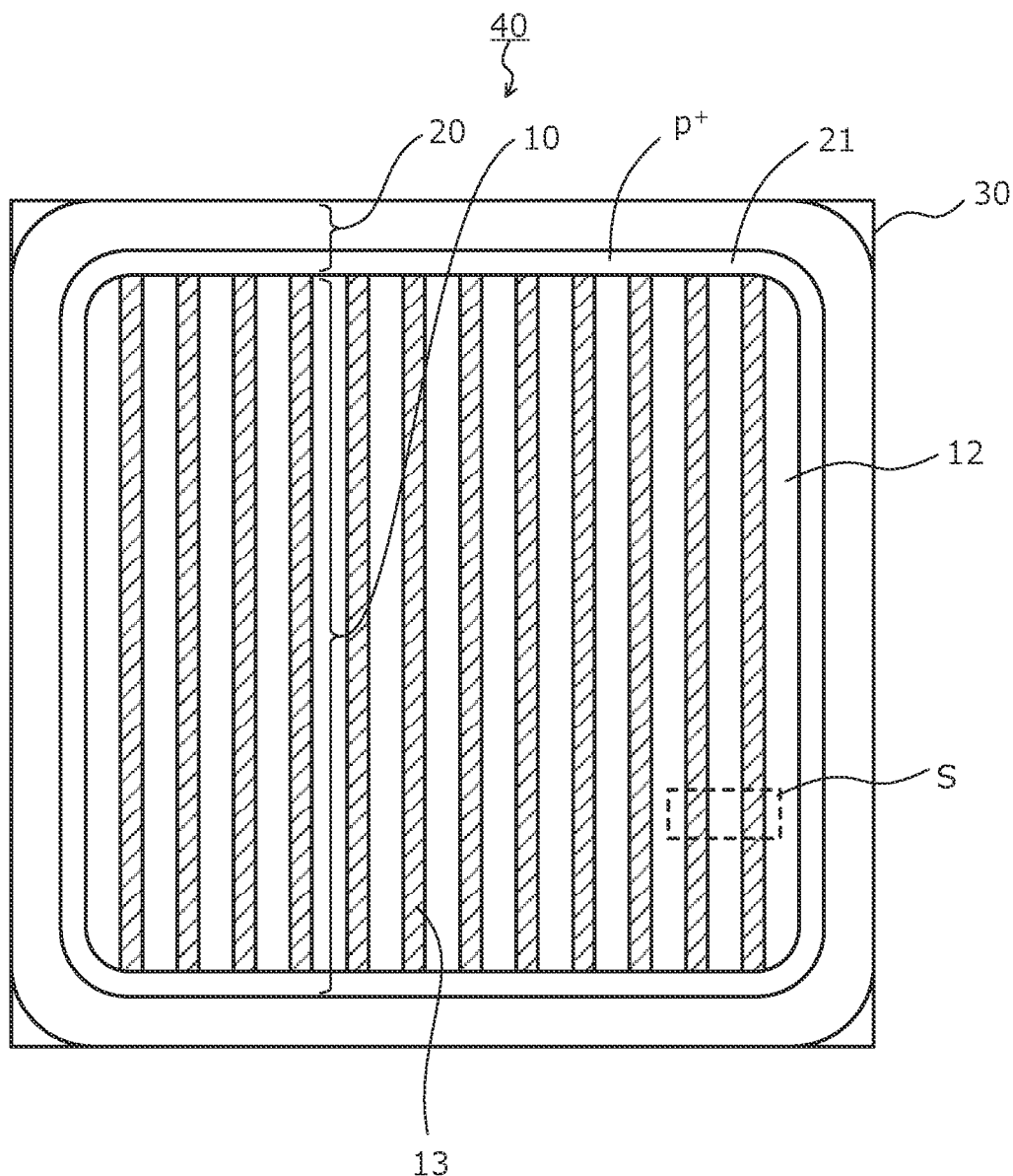
FIG. 1 is a plan view of a silicon carbide semiconductor device according to an embodiment, as viewed from a front side of a semiconductor substrate.
Figure 2:
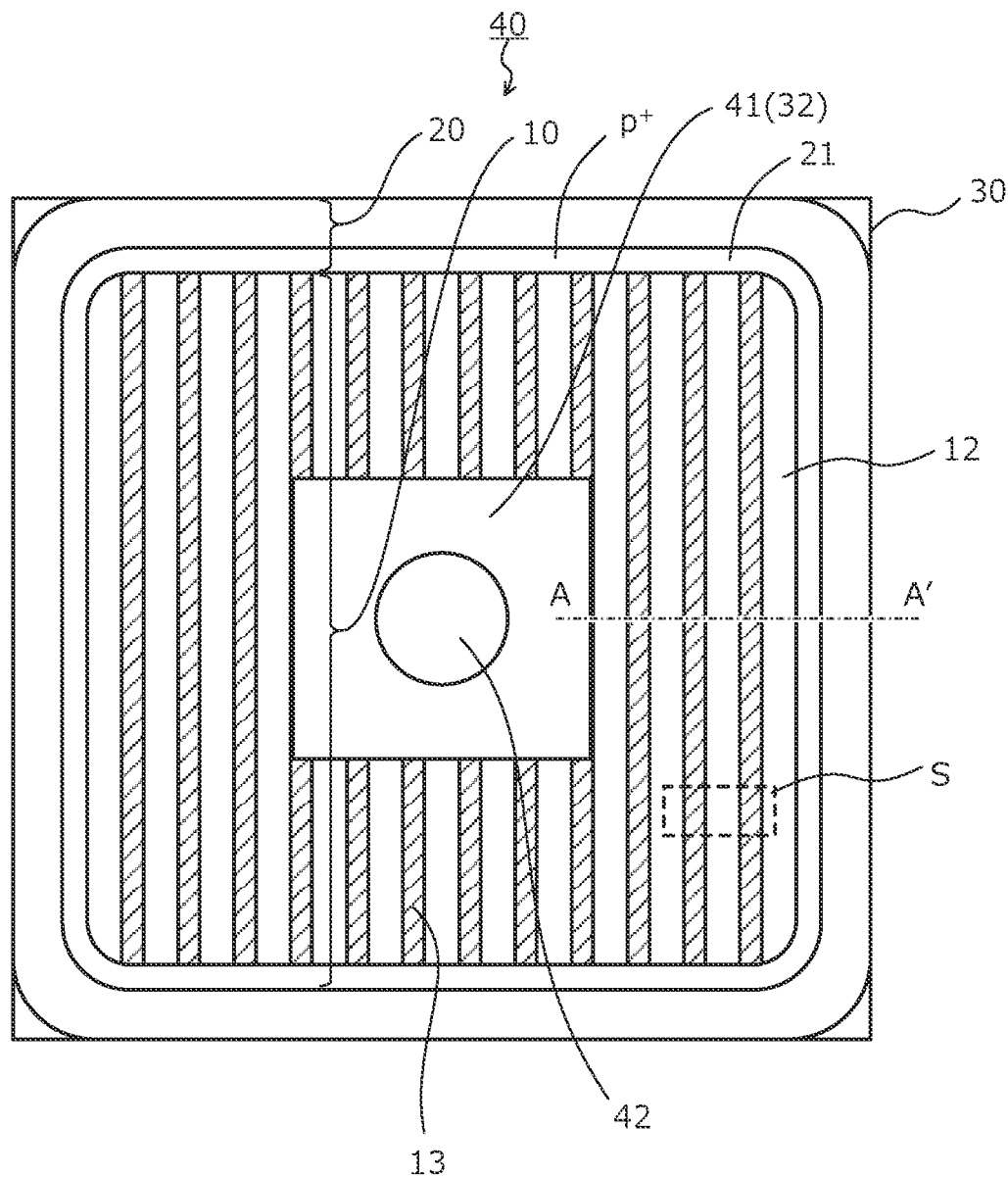
FIG. 2 is a plan view of the silicon carbide semiconductor device according to the embodiment, as viewed from a front side of a semiconductor substrate.

A structure of a silicon carbide semiconductor device according to an embodiment will be described. FIGS. 1 and 2 are plan views of the silicon carbide semiconductor device according to the embodiment, as viewed from a front side of a semiconductor substrate. FIG. 1 depicts one example of a layout of p-type regions (first second-conductivity-type regions) 13 configuring JBS structures. FIG. 2 depicts another example of a layout of a bonding pad 41 among parts on a front surface of a semiconductor substrate (semiconductor chip) 30 containing silicon carbide (SiC).

A silicon carbide semiconductor device 40 according to the embodiment and depicted in FIGS. 1 and 2 is a silicon carbide diode having, in an active region 10, at a front side of the semiconductor substrate 30, a mixture of a SBD structure configured by Schottky junctions between a front electrode (first electrode) 14 (refer to FIG. 3) and an n$^-$-type drift region (first-conductivity-type region) 12, and JBS structures configured by pn junctions between the p-type regions 13 and the n$^-$-type drift region 12.

The n$^-$-type drift region 12 and the p-type regions 13 are disposed in a substantially uniform pattern at a surface of the active region 10. The n$^-$-type drift region 12 and the p-type regions 13, for example, are disposed in striped patterns that extend along a same direction parallel to a front surface of the semiconductor substrate 30, and are disposed to be in contact with one another and repeatedly alternate one another along a width direction opposite to a length direction in which the striped patterns extend. The n$^-$-type drift region 12 is exposed at the front surface of the semiconductor substrate 30, between adjacent p-type regions 13 among the p-type regions 13.

The active region 10 is a region through which current flows when the silicon carbide diode is in an ON state. The active region 10, for example, has a substantially rectangular planar shape and is disposed at substantially a center of the semiconductor substrate 30. An edge termination region 20 is a region between the active region 10 and an end of the semiconductor substrate 30 and surrounds a periphery of the active region 10. The edge termination region 20 is a region of the n$^-$-type drift region 12, mitigating electric field of the front side of the semiconductor substrate 30 and sustaining a breakdown voltage. The breakdown voltage is a voltage limit at which no erroneous operation or destruction of an element occurs.

Figure 3:
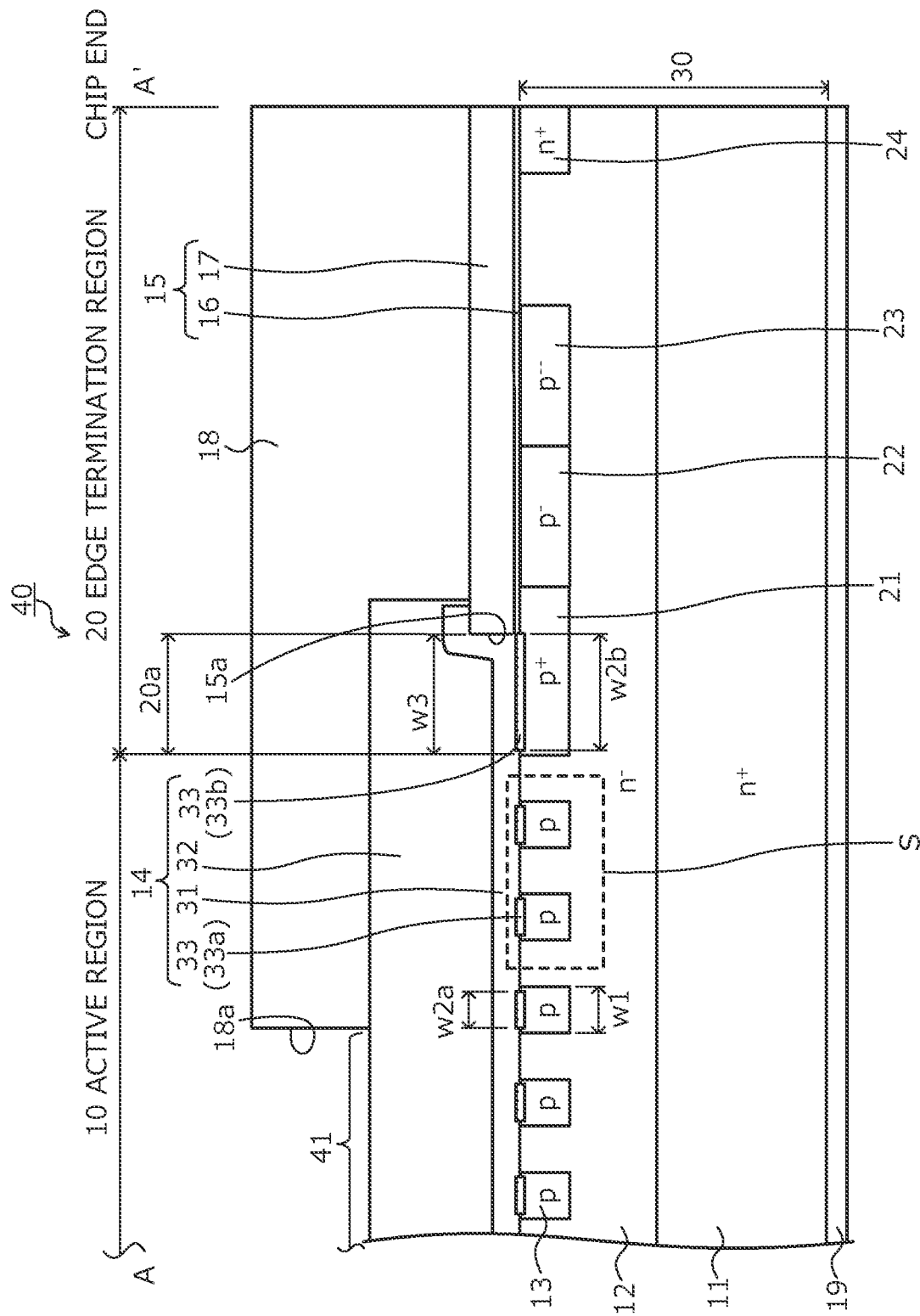
FIG. 3 is a cross-sectional view of a structure along cutting line A-A' in FIG. 2.

In the edge termination region 20, a voltage withstanding structure such as a junction termination extension (JTE) structure is disposed (refer to FIG. 3). The JTE structure is a voltage withstanding structure having a substantially rectangular planar shape surrounding a periphery of the active region 10, in which multiple p-type regions (reference numerals 22, 23 in FIG. 3) having differing impurity concentrations are disposed in descending order of impurity concentration from nearest a center (center of the semiconductor substrate 30) toward ends (ends of the semiconductor substrate 30).

Further, in a connecting region 20a (refer to FIG. 3) of the edge termination region 20, a field limiting ring (FLR (second second-conductivity-type region)) 21 is disposed. The FLR 21 is a p$^+$-type region surrounding a periphery of the active region 10 in a substantially rectangular shape and extends from the connecting region 20a of the edge termination region 20 toward the ends of the semiconductor substrate 30 to be in contact with a p$^-$-type region 22 (refer to FIG. 3) described hereinafter. In a length direction in which the p-type regions 13 extend in the striped pattern, the FLR 21 may be in contact with the p-type regions 13.

The connecting region 20a of the edge termination region 20 is a region between the active region 10 and a field oxide film 15 described hereinafter, surrounding a periphery of the active region 10 and connecting the active region 10 and a voltage withstanding structure part of the edge termination region 20. The voltage withstanding structure part of the edge termination region 20 is a region in the edge termination region 20, from center-side edges of the field oxide film 15 described hereinafter facing the center of the semiconductor substrate 30 to the ends (chip ends) of the semiconductor substrate 30, and in which predetermined voltage withstanding structures such as an $n^+$-type channel stopper region 24 (refer to FIG. 3) and the JTE structure are provided.

A front electrode 14 (refer to FIG. 3) is provided on the front surface of the semiconductor substrate 30, in the active region 10. The front electrode 14 is in contact with the $n^-$-type drift region 12 and the p-type regions 13, and is electrically connected to the $n^-$-type drift region 12 and the p-type regions 13. On the front surface of the semiconductor substrate 30, a passivation film 18 (refer to FIG. 3) is provided. The passivation film 18 functions as a protective film protecting element structures of the front side of the semiconductor substrate 30 and the front electrode 14.

In the passivation film 18 an opening 18a that exposes a part of the front electrode 14 is provided. The part of the front electrode 14 exposed in the opening 18a of the passivation film 18 functions as the bonding pad 41. The bonding pad 41, for example, is disposed in the center of the semiconductor substrate 30. Bonded (joined) to the bonding pad 41 is a non-depicted aluminum (Al) wire, which is the most common wiring connection when current is to be supplied to the bonding pad 41.

In FIG. 2, a bonding part 42 of the bonding pad 41 and the aluminum wire (not depicted) is depicted in a circular planar shape. For the bonding part 42 of the bonding pad 41 and the aluminum wire, for example, a surface area of about 1 square mm has to be assumed when an aluminum wire having a diameter of 500 μm is bonded to the bonding pad 41. A reason for this is that the flow of surge current flowing in the forward direction during surge voltage application at the surface of the semiconductor substrate 30 differs according to the breakdown voltage of the silicon carbide diode.

While disposal of the bonding pad 41 in the center of the semiconductor substrate 30 is advantageous, as described above, the $n^-$-type drift region 12 and the p-type regions 13 are disposed substantially evenly in a substantially uniform pattern at the surface of the active region 10 and therefore, even when the bonding pad 41 is not disposed in the center of the semiconductor substrate 30, electrical characteristics are not adversely affected. Therefore, the degrees of freedom for wire bonding is high.

Next, a cross-section of the structure of the silicon carbide semiconductor device 40 according to the embodiment will be described. FIG. 3 is a cross-sectional view of the structure along cutting line A-A' in FIG. 2. As described above, the silicon carbide semiconductor device 40 according to the embodiment includes the JBS structures and the SBD structure of the silicon carbide diode in the active region 10 of the semiconductor substrate 30 containing silicon carbide and includes the JTE structure in the edge termination region 20 as a voltage withstanding structure.

The semiconductor substrate 30 is an epitaxial substrate in which an $n^-$-type epitaxial layer that forms the $n^-$-type drift region 12 is stacked on a front surface of an $n^+$-type starting substrate 11 containing silicon carbide. The $n^+$-type starting substrate 11 is an $n^+$-type cathode region. The semiconductor substrate 30 has a main surface that is regarded as a front surface and that is a surface of the $n^-$-type epitaxial layer formed by the $n^-$-type drift region 12 and has another main surface that is regarded as a back surface and that is a back surface of the $n^+$-type starting substrate 11.

In the active region 10, in surface regions of the front side of the semiconductor substrate 30, at least one of the p-type regions 13 configuring one of the JBS structures is selectively provided. The p-type regions 13 are provided between the front surface of the semiconductor substrate 30 and the $n^-$-type drift region 12. The p-type regions 13 are exposed at the front surface of the semiconductor substrate 30 and in contact with the $n^-$-type drift region 12.

In the edge termination region 20, in surface regions of the front side of the semiconductor substrate 30, the FLR 21, at least one p-type region (here, two: the $p^-$-type region 22 and the $p^{--}$-type region 23) configuring the JTE structure, and the $n^+$-type channel stopper region 24 are respectively provided selectively. The FLR 21 is provided in an entire area of the connecting region 20a of the edge termination region 20, the FLR 21 extending from the connecting region 20a toward the ends of the semiconductor substrate 30 and in contact with the $p^-$-type region 22. A region closer to the center of the semiconductor substrate 30 than is the FLR 21 is the active region 10.

The $p^-$-type region 22 is separate from the connecting region 20a of the edge termination region 20, provided closer to the ends of the semiconductor substrate 30 than is the FLR 21 and is adjacent to the FLR 21. The $p^{--}$-type region 23 is provided adjacent to the $p^-$-type region 22 and closer to the ends of the semiconductor substrate 30 than is the $p^-$-type region 22. The $n^+$-type channel stopper region 24 is provided separate from the $p^{--}$-type region 23, closer to the ends of the semiconductor substrate 30 than is the $p^{--}$-type region 23. The $n^+$-type channel stopper region 24 is exposed at the ends (chip ends) of the semiconductor substrate 30.

The FLR 21, the $p^-$-type region 22, the $p^{--}$-type region 23, and the $n^+$-type channel stopper region 24 are provided between the front surface of the semiconductor substrate 30 and the $n^-$-type drift region 12. The FLR 21, the $p^-$-type region 22, the $p^{--}$-type region 23, and the $n^+$-type channel stopper region 24 are exposed at the front surface of the semiconductor substrate 30 and are in contact with the $n^-$-type drift region 12. Depths of the FLR 21, the $p^-$-type region 22, the $p^{--}$-type region 23, and the $n^+$-type channel stopper region 24, for example, are equal to the depth of the p-type regions 13.

The front surface of the semiconductor substrate 30 is covered by the field oxide film 15. The field oxide film 15 may be a stacked film in which, for example, a thermal oxide film 16 and a deposited oxide film 17 are sequentially stacked. The thermal oxide film 16 may enhance adhesiveness between the semiconductor substrate 30 and the field oxide film 15. The field oxide film 15 includes the deposited oxide film 17, thereby enabling the field oxide film 15 to be formed in less time than in a case where the field oxide film 15 is used for the thermal oxide film 16.

In the field oxide film 15, a contact hole 15a that exposes substantially an entire area of the front surface of the semiconductor substrate 30 in the active region 10 is provided. An inner wall (side surface of the field oxide film 15 facing the center of the semiconductor substrate 30) of the contact hole 15a of the field oxide film 15, for example, is substantially orthogonal to the front surface of the semiconductor substrate 30. The contact hole 15a of the field oxide film 15 is provided in an entire region spanning the active region 10 and the connecting region 20a of the edge termination region 20.

In the contact hole 15a of the field oxide film 15, the n⁻-type drift region 12 and the p-type regions 13 in the active region 10 as well as a center-side part of the FLR 21 in the edge termination region 20 are exposed. In the contact hole 15a of the field oxide film 15, on the front surface of the semiconductor substrate 30, the front electrode 14 that functions as an anode electrode is provided along the front surface of the semiconductor substrate 30.

The front electrode 14 has a stacked structure in which a titanium film 31 and an aluminum alloy film (metal electrode film containing aluminum) 32 are sequentially stacked. In addition, the front electrode 14 has nickel silicide (NiSi) films 33 (33a, 33b) that are a lowermost layer provided selectively between the front surface of the semiconductor substrate 30 and the titanium film 31. The nickel silicide films 33 contain aluminum. The nickel silicide films 33 may contain carbon (C). The front electrode 14 may extend on the field oxide film 15 toward the ends of the semiconductor substrate 30.

The titanium film 31 is provided in an entire area of the front surface of the semiconductor substrate 30 in the contact hole 15a and is in contact with the n⁻-type drift region 12. Bonding areas of the titanium film 31 bonded to the n⁻-type drift region 12 form Schottky electrodes that form Schottky junctions with the n⁻-type drift region 12. The titanium film 31 may extend on the field oxide film 15 toward the ends of the semiconductor substrate 30 and, for example, terminate at a position facing the FLR 21 in a depth direction.

The aluminum alloy film 32 covers an entire surface of the titanium film 31, is electrically connected to the titanium film 31, and through the titanium film 31, is electrically connected to the nickel silicide films 33. The aluminum alloy film 32 may extend on the field oxide film 15 closer to the ends of the semiconductor substrate 30 than is the titanium film 31 and, for example, may terminate at a position facing the p⁻-type region 22 in the depth direction. The aluminum alloy film 32, for example, is an aluminum silicon (AlSi) film. Instead of the aluminum alloy film 32, an aluminum film may be provided.

The nickel silicide films 33 include first nickel silicide films 33a provided between each of the p-type regions 13 and the titanium film 31, and a second nickel silicide film 33b provided between the FLR 21 and the titanium film 31. The first nickel silicide films 33a are ohmic electrodes that are in ohmic contact with the p-type regions 13. The first nickel silicide films 33a have a function of enhancing the surge current capability by increasing the current amount (pulled amount) of surge current pulled from inside the semiconductor substrate 30 out to the front electrode 14, the surge current being generated in the semiconductor substrate 30 during application of surface voltage and flowing in the forward direction.

The first nickel silicide films 33a, as described hereinafter, are formed in regions of contact between the p-type regions 13 and a metal material film 52 (refer to FIG. 20) deposited on the front surface of the semiconductor substrate 30 through a reaction caused between surface regions of the semiconductor substrate 30 and the metal material film 52 by a heat treatment. Therefore, the first nickel silicide films 33a are provided in the surface regions of the front surface of the semiconductor substrate 30, are in contact with the p-type regions 13 in the depth direction, and protrude from the front surface of the semiconductor substrate 30 in a direction away from the front surface of the semiconductor substrate 30.

Figure 4:
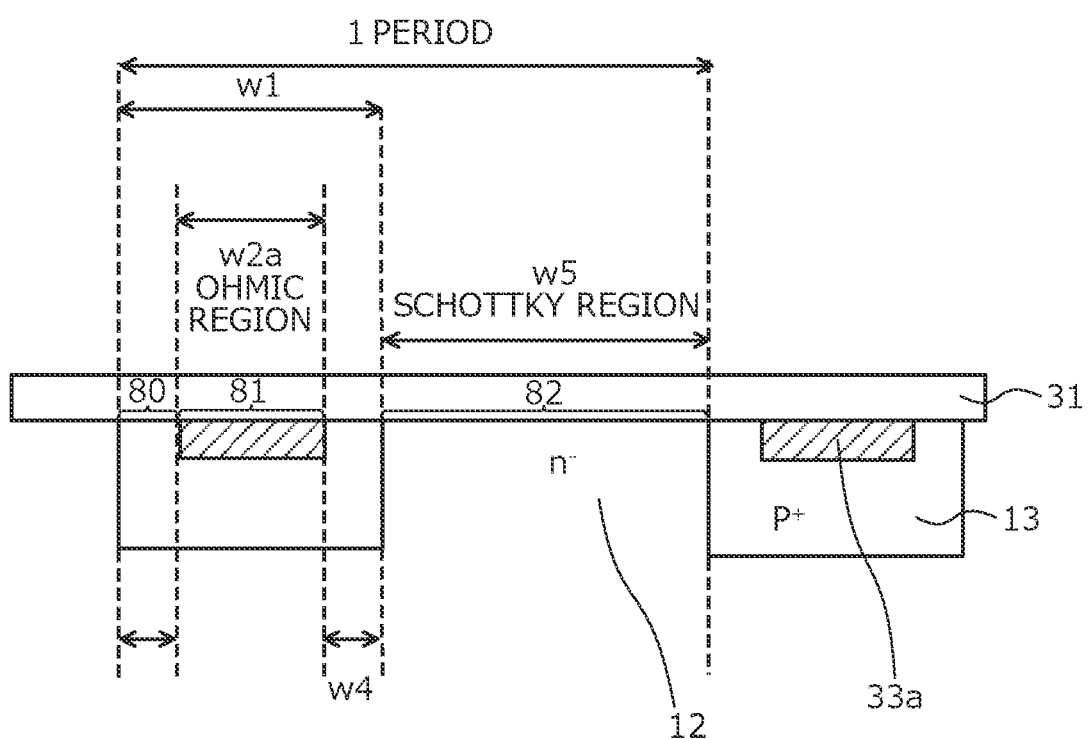
FIG. 4 is a detailed cross-sectional view of a structure of a region S surrounded by a dashed line in FIGS. 1 to 3.

FIG. 4 is a detailed cross-sectional view of the structure of a region S surrounded by a dashed line in FIGS. 1 to 3. As depicted in FIG. 4, a width w2a of the first nickel silicide films 33a is less than a width w1 of the p-type regions 13. Since the width w2a of the first nickel silicide films 33a is less than the width w1 of the p-type regions 13, the p-type regions 13 are exposed at the front surface of the semiconductor substrate 30. As a result, Schottky junctions having high resistance are formed between the p-type regions 13 and the titanium film 31.

The active region 10 includes non-operating regions 80 disposed in a striped pattern and in which the titanium film 31 is in contact with the p-type regions 13 that configure the JBS structures, ohmic regions 81 disposed in a striped pattern and in which the titanium film 31 is in contact with the first nickel silicide films 33a, Schottky regions 82 disposed in a striped pattern and in which the titanium film 31 is in contact with the n⁻-type drift region 12. In this manner, a period of four regions including one of the ohmic regions 81, two of the non-operating regions 80 surrounding said one ohmic region 81, and one of the Schottky regions 82 occurs recursively in the active region 10. The striped patterns are of long, thin rectangular shapes that are shorter in a horizontal direction than in a vertical direction as depicted in FIGS. 1 and 2.

Such a periodic structure enables a high density of the ohmic regions 81 to be disposed uniformly in an entire area of the active region 10. Therefore, when a large surge current flows in the forward direction in the semiconductor substrate, the surge current may be dispersed, thereby enabling IFSM characteristics to be improved.

Figure 5:
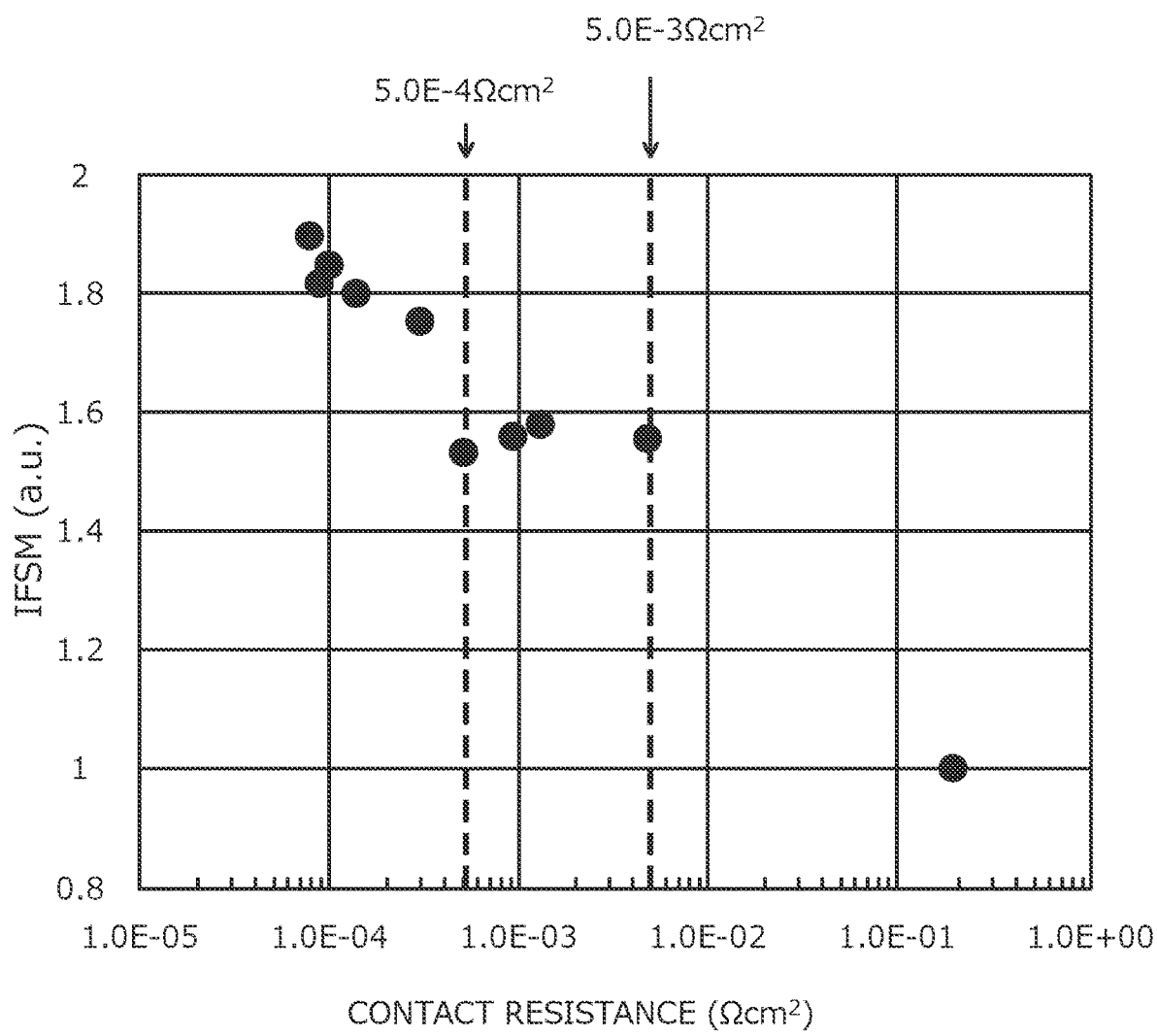
FIG. 5 is a graph depicting IFSM characteristics with respect to contact resistance.

Here, FIG. 5 is a graph depicting IFSM characteristics with respect to contact resistance. In FIG. 5, a horizontal axis indicates contact resistance in units of $\Omega cm^2$ while a vertical axis indicates IFSM characteristics. As depicted in FIG. 5, it is found that when the contact resistance is at most $5.0 \times 10^{-3}$ cm², the IFSM characteristics greatly improve and when the contact resistance is at most $5.0 \times 10^{-4}$ cm², the IFSM characteristics further improve. It is believed that as the contact resistance decreases, the amount of heat generated by the resistance decreases and the IFSM characteristics improve.

To improve the IFSM characteristics, the ohmic regions 81 may be low-resistance regions having contact resistance that is at most $5.0 \times 10^{-3}$ cm² or more advantageously, at most $5.0 \times 10^{-4}$ cm². On the other hand, the non-operating regions 80 may be high-resistance regions having, for example, contact resistance of at least $1.0 \times 10^{-3}$ cm². By forming the ohmic regions 81 to have a low resistance such as these, IFSM may be increased. Further, the non-operating regions 80 may have a width w4 that is in a range, for example, from 0.1 μm to 2 μm.

Further, as depicted in FIGS. 1 and 2, the p-type regions 13 are connected to a guard ring (in FIGS. 1 and 2, the FLR 21) provided in the edge termination region 20. In other words, in the edge termination region 20, the ohmic regions 81 and the non-operating regions 80 are connected to the edge termination region 20. Further, when the second nickel silicide film 33b is also provided in the guard ring, the first nickel silicide films 33a of the ohmic regions 81 are in contact with the second nickel silicide film 33b.

In a form in which conventional dot-shaped ohmic electrodes are disposed (refer to FIG. 30), near an outer periphery, parts that are far from and parts that are near the ohmic electrodes occur, however, in the embodiment, even near the outer periphery, the ohmic electrodes are uniformly disposed. As a result, when surge current flows, this current may be more uniformly dispersed, enabling local concentration of the current to be avoided, whereby the IFSM characteristics may be improved. Further, each of the non-operating regions 80 is certainly sandwiched between one of the ohmic regions 81 and one of the Schottky regions 82. As a result, the non-operating regions 80 pass carriers through the ohmic regions 81, thereby enabling leak current to be reduced.

Further, the non-operating regions 80 are provided around the ohmic regions 81, and in the active region 10, the ohmic regions 81 are not connected to one another. In other words, between adjacent first nickel silicide films 33a of the first nickel silicide films 33a, the non-operating regions 80 and the Schottky region 82 are present. In this manner, in the embodiment, ohmic regions that are wide so as to straddle multiple stripes of the ohmic regions 81 do not exist. For example, wide ohmic regions such as the conventional ohmic electrodes (refer to FIG. 30) on the p-type regions 113' are not present. As a result, the area of the ohmic regions 81 does not increase and therefore, Vf characteristics may be maintained.

Such a structure, for example, as described hereinafter, may be formed using a nickel silicide generated by causing a surface region of the semiconductor substrate 30 and the metal material film 52 formed by sequentially depositing nickel, aluminum, and nickel to react through a heat treatment. The first nickel silicide films 33a having a low resistance are formed by self-alignment by removing through etching, the parts (parts excluding the heating reaction layer) of the metal material film 52 not converted into a silicide. Because the metal material film 52 in which nickel, aluminum, and nickel are sequentially stacked in order stated is used, p-type ohmic electrodes having low resistance are formed. Further, formation by self-alignment enables the ohmic electrodes to be formed within the JBS structures each having a width of a few μm, thereby enabling Vf characteristics to be maintained. In this manner, the ohmic regions 81 may be formed to have low resistance without reducing the area of the Schottky regions 82 and therefore, IFSM characteristics may be improved while maintaining the Vf characteristics.

Further, the width w2a of the first nickel silicide films 33a is less than the width w1 of the p-type regions 13, thereby enabling the setting of a design margin for enhancing positioning accuracy of a mask (remaining part of the field oxide film 15 described hereinafter, refer to FIG. 10) used when the first nickel silicide films 33a are formed. As a result, the first nickel silicide films 33a may be disposed at positions facing the p-type regions 13 in the depth direction with favorable positioning accuracy.

Figure 6:
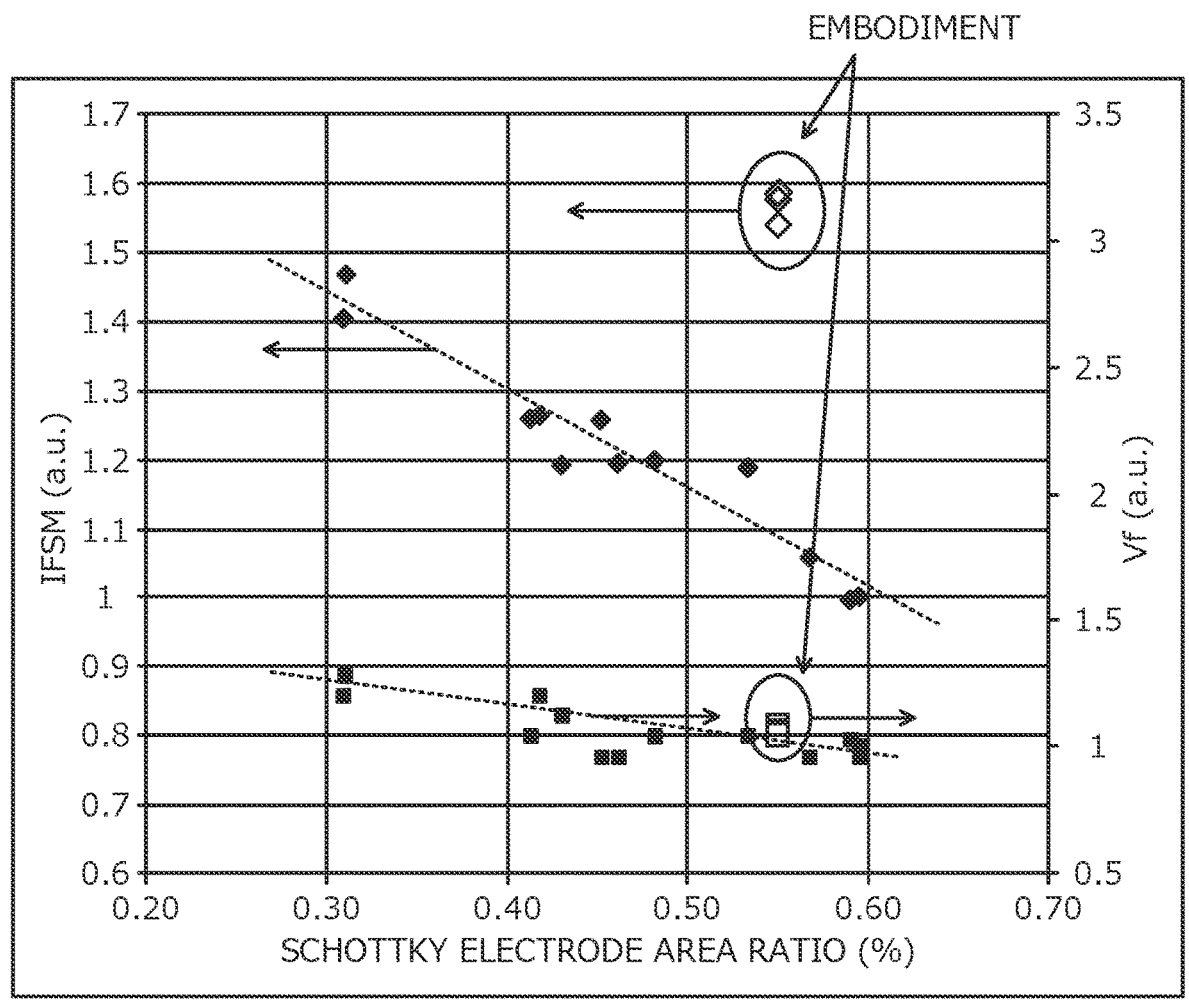
FIG. 6 is a graph depicting IFSM and Vf with respect to Schottky electrode area ratio.

FIG. 6 is a graph depicting IFSM and Vf with respect to Schottky electrode area ratio. In FIG. 6, a horizontal axis indicates area ratio of the Schottky electrodes in units of percentage. The area ratio of the Schottky electrodes is a ratio of the area of the Schottky regions to the area of the entire active region 10. The active region 10 is configured by the non-operating regions 80, the ohmic regions 81, and the Schottky regions 82 and therefore, the area ratio of Schottky electrodes is the area of the Schottky regions 82/(the area of the Schottky regions 82+the area of the ohmic regions 81+the area of the non-operating regions 80). Further, the area ratio is a result of varying the area of the Schottky regions 82 while keeping the area of the ohmic regions 81 constant. Further, a left-vertical axis indicates IFSM and a right-vertical axis indicates Vf. In FIG. 6, "■" and "□" represent Vf while "◆" and "◇" represent IFSM. Further, "■" and "◆" are for an instance of the conventional silicon carbide semiconductor device in which ohmic electrodes are also formed on the p-type regions 113' that are dot-shaped while "□" and "◇" are for an instance of the silicon carbide semiconductor device of the embodiment. In FIG. 6, these symbols are displayed overlapping one another. For example, in the instance of the silicon carbide semiconductor device of the embodiment, three of the "□" overlap one another.

As depicted in FIG. 6, it is found that for the conventional silicon carbide semiconductor device, when the area ratio of the Schottky electrodes is reduced, IFSM improves with the value thereof increasing, however, Vf degrades with the value thereof increasing. On the other hand, for the embodiment, a width w5 of the Schottky regions 82 and the width w2a of the ohmic regions 81 are adjusted so that the area of the Schottky regions 82 and the area of the ohmic regions 81 are about equal (more accurately, the area ratio of the Schottky electrodes is set to about 55%), thereby enabling the Vf characteristics to be maintained while the IFSM characteristics are improved.

Further, in the active region 10, an area ratio of the non-operating regions 80 may be preferably in a range from 15% to 35%. Further, in the active region 10, an area ratio of the ohmic regions 81 may be preferably in a range from 10% to 35%. In the active region 10, an area ratio of the Schottky regions 82 may be preferably in a range from 35% to 65%. In this instance, a sum of the non-operating regions 80 and the ohmic regions 81 is in a range from 35% to 65% with respect to the active region 10. The respective area ratios are selected from values so that a sum of the area ratio of the non-operating regions 80, the area ratio of the ohmic regions 81, and the area ratio of the Schottky regions 82 is 100%. By setting the area ratios within these ranges, enhanced surge current capability and low Vf characteristics may both be achieved.

Here, in the active region 10, the area ratio of the non-operating regions 80 is the area of the non-operating regions 80/(the area of the Schottky regions 82+the area of the ohmic regions 81+the area of the non-operating regions 80) and as depicted in FIG. 4, when the Schottky regions 82 and the ohmic regions 81 are provided to respectively alternate one another, the area ratio of the non-operating regions 80 is obtained by 2×w4/(2×w4+w2a+w5). Similarly, in the active region 10, the area ratio of the ohmic regions 81 is the area of the ohmic regions 81/(the area of the Schottky regions 82+the area of the ohmic regions 81+the area of the non-operating regions 80) and as depicted in FIG. 4, when the Schottky regions 82 and the ohmic regions 81 are provided to respectively alternate one another, the area ratio of the ohmic regions 81 is obtained by w2a/(2×w4+w2a+w5). Further, in the active region 10, the area ratio of the Schottky regions 82 is equal to the area ratio of the Schottky electrodes and as depicted in FIG. 4, when the Schottky regions 82 and the ohmic regions 81 are provided so as to alternate one another, the area ratio of the Schottky regions 82 is obtained by w5/(2×w4+w2a+w5).

The second nickel silicide film 33b is an ohmic electrode in ohmic contact with the FLR 21. The second nickel silicide film 33b may be provided in substantially an entire area of the surface of the FLR 21 in the connecting region 20a of the edge termination region 20. The second nickel silicide film 33b is in contact with the field oxide film 15 at a sidewall of the field oxide film 15. The second nickel silicide film 33b, similarly to the first nickel silicide films 33a, has a function of increasing the pulled amount of the surge current and enhancing the surge current capability.

Provision of the second nickel silicide film 33b enables the ohmic electrode having a same function as that of the first nickel silicide films 33a to be disposed in the connecting region 20a of the edge termination region 20. As a result, even when the chip size (flat planar dimensions of the front surface of the semiconductor substrate 30) is reduced, by the total contact area between the first and the second nickel silicide films 33a, 33b and the semiconductor substrate 30, the area of ohmic contact between the front electrode 14 and the semiconductor substrate 30 may be sufficiently established as necessary to obtain a predetermined surge current capability.

Further, the second nickel silicide film 33b extends toward the ends of the semiconductor substrate 30 to a position to be in contact with the field oxide film 15, whereby the area of ohmic contact between the FLR 21 and the second nickel silicide film 33b may be maximized. As a result, a width w2b of the second nickel silicide film 33b becomes substantially equal to a width w3 of the connecting region 20a of the edge termination region 20 and as described above, the second nickel silicide film 33b may be provided on substantially the entire area of the surface of the FLR 21 in the connecting region 20a of the edge termination region 20.

Further, the width w2b of the second nickel silicide film 33b is substantially equal to the width w3 of the connecting region 20a of the edge termination region 20, thereby enabling reduction of the forward voltage of the silicon carbide diode similarly to an instance in which the width w2a of the first nickel silicide films 33a is substantially equal to the width w1 of the p-type regions 13. The width w2b of the second nickel silicide film 33b, for example, may be less than the width w3 of the connecting region 20a of the edge termination region 20. A reason for this is the same as the reason that the width w2a of the first nickel silicide films 33a may be less than the width w1 of the p-type regions 13.

The second nickel silicide film 33b, as described hereinafter, is formed in a contact region between the FLR 21 and the metal material film 52 deposited on the front surface of the semiconductor substrate 30, by causing the semiconductor substrate 30 and the metal material film 52 to react by a heat treatment. The second nickel silicide film 33b is provided in a surface region of the front surface of the semiconductor substrate 30 to be in contact with the FLR 21 in the depth direction and to protrude from the front surface of the semiconductor substrate 30 in a direction away from the front surface of the semiconductor substrate 30.

Parts of the front surface of the semiconductor substrate 30 other than the part in contact with the front electrode 14 are covered by the field oxide film 15. On an uppermost surface of the front surface of the semiconductor substrate 30, the passivation film 18 containing a polyimide is provided. Here, on a top of the $n^+$-type channel stopper region 24, a channel stopper electrode in contact with and electrically connected to the $n^+$-type channel stopper region 24 may be provided. The channel stopper electrode, for example, may be an aluminum alloy film formed concurrently with the aluminum alloy film 32.

The passivation film 18 is a protective film that protects the front electrode 14 and the field oxide film 15. In the passivation film 18, the opening 18a that exposes a part of the aluminum alloy film 32 is provided in the active region 10. The part of the front electrode 14 exposed in the opening 18a of the passivation film 18 functions as the bonding pad 41. On an entire area of the back surface (the back surface of the $n^+$-type starting substrate 11) of the semiconductor substrate 30, a back electrode (second electrode) 19 is provided electrically connected to the $n^+$-type starting substrate 11.

Figure 7:
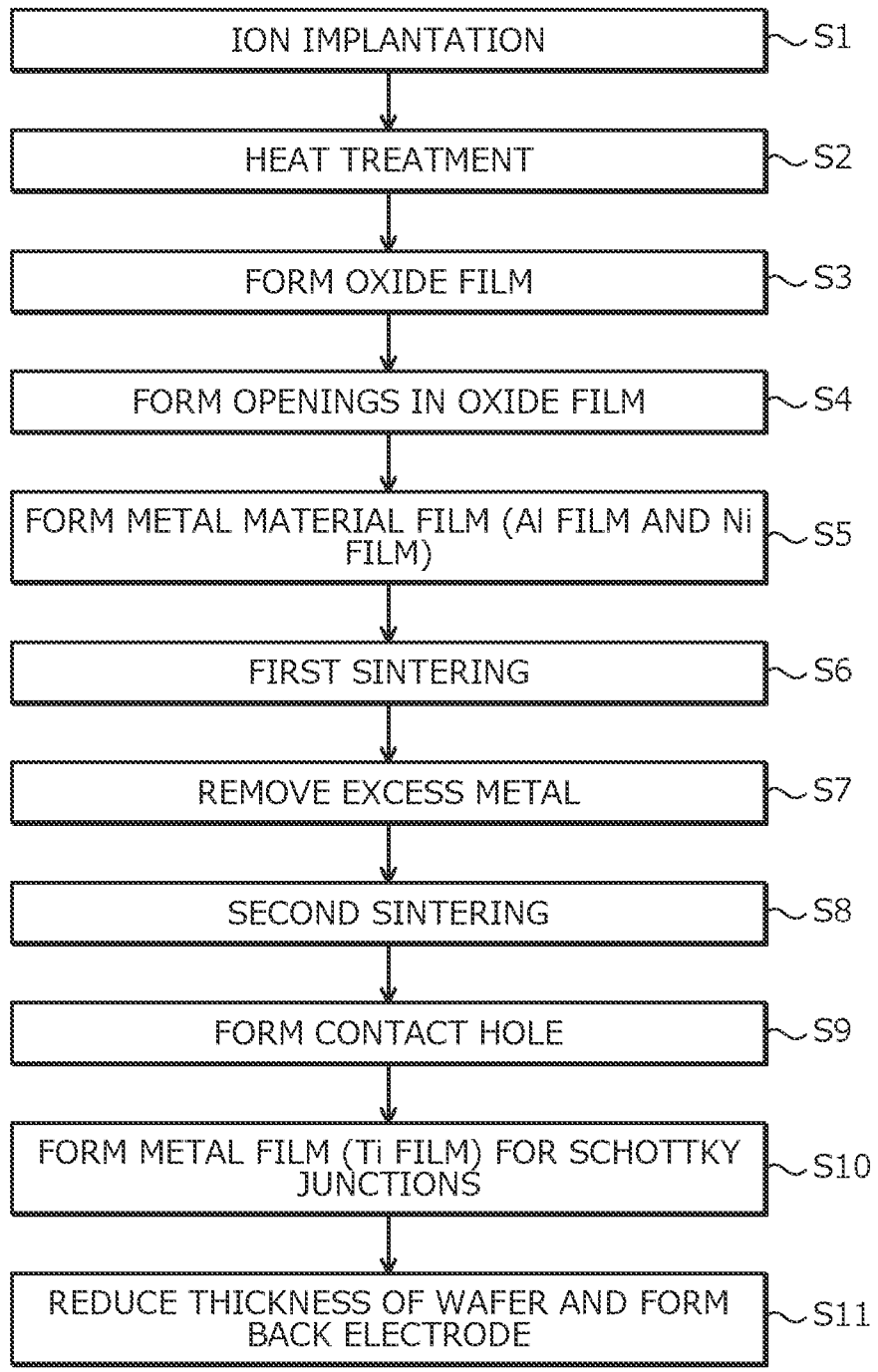
FIG. 7 is a flowchart of an outline of a method of manufacturing the silicon carbide semiconductor device according to the embodiment.
Figure 19:
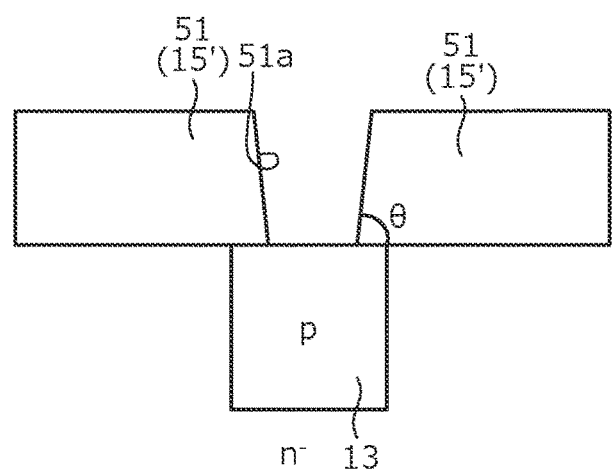
FIG. 19 is a detailed cross-sectional view of an opening formed in an oxide film of the silicon carbide semiconductor device according to the embodiment.
Figure 20:
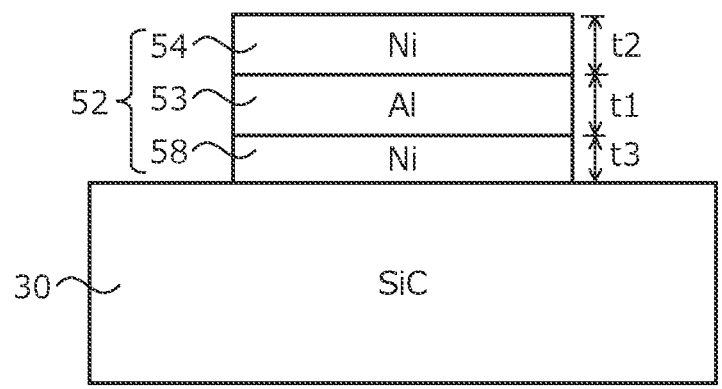
FIG. 20 is a cross-sectional view schematically depicting a state of a front electrode of the silicon carbide semiconductor device according to the embodiment during manufacture.
Figure 21:
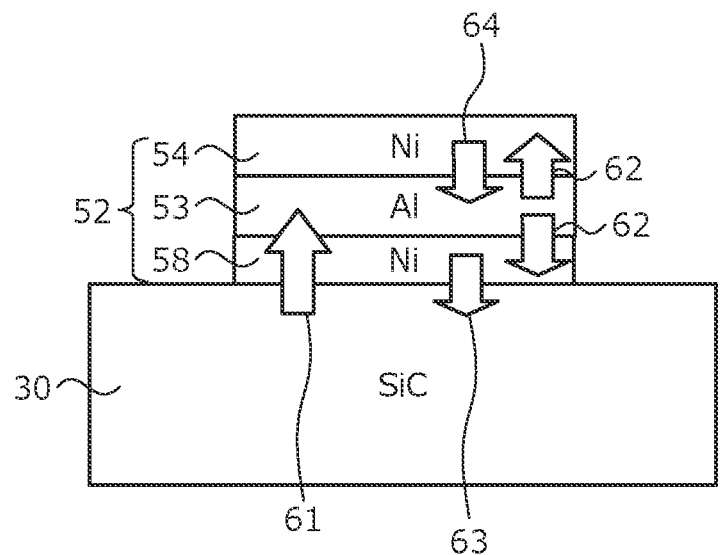
FIG. 21 is a cross-sectional view schematically depicting a state of the front electrode of the silicon carbide semiconductor device according to the embodiment during manufacture.
Figure 22:
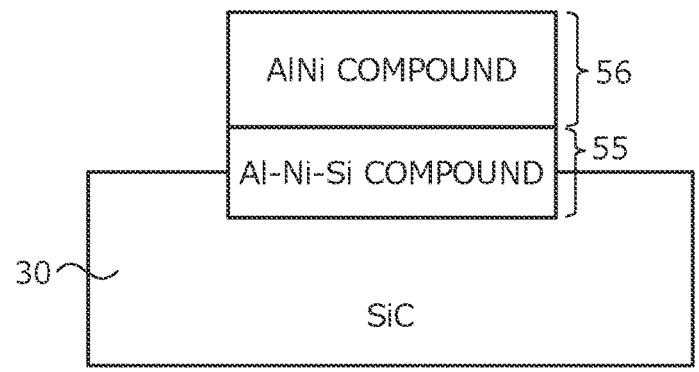
FIG. 22 is a cross-sectional view schematically depicting a state of the front electrode of the silicon carbide semiconductor device according to the embodiment during manufacture.

Next, a method of manufacturing the silicon carbide semiconductor device 40 according to the embodiment will be described. FIG. 7 is a flowchart of an outline of the method of manufacturing the silicon carbide semiconductor device according to the embodiment. FIGS. 8, 9, 10, 11, 12, 13, 14, 15, 16, 17, and 18 are cross-sectional views of states of the silicon carbide semiconductor device according to the embodiment during manufacture. FIG. 19 is a detailed cross-sectional view of an opening formed in an oxide film of the silicon carbide semiconductor device according to the embodiment. FIGS. 20, 21, and 22 are cross-sectional views schematically depicting states of the front electrode of the silicon carbide semiconductor device according to the embodiment during manufacture.

Figure 8:
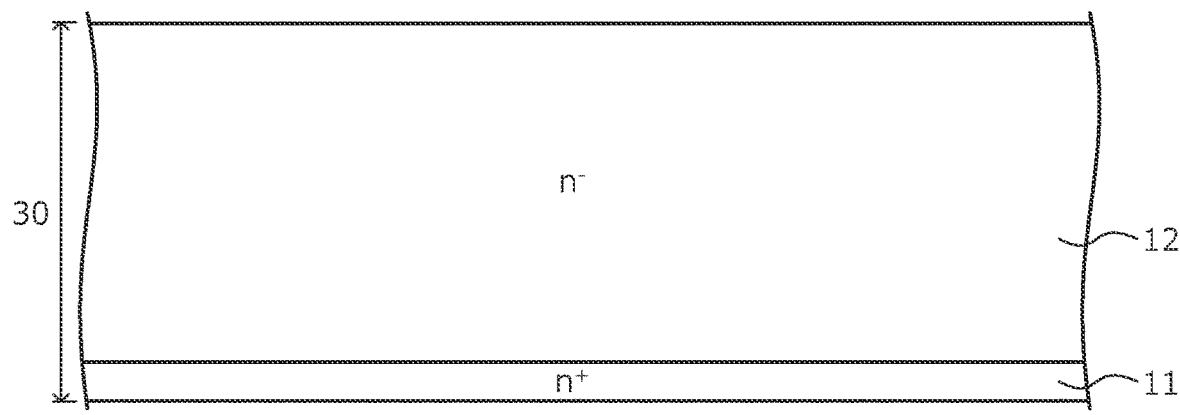
FIG. 8 is a cross-sectional view of a state of the silicon carbide semiconductor device according to the embodiment during manufacture.

First, as depicted in FIG. 8, as the $n^+$-type starting substrate (semiconductor wafer) 11, four-layer periodic hexagonal crystal (4H—SiC) silicon carbide substrate doped with, for example, about $5\times10^{18}/cm^3$ of nitrogen (N) is prepared. The front surface of the $n^+$-type starting substrate 11, for example, may have an off angle of about 4 degrees with respect to a (0001) plane. Next, on the front surface of the $n^+$-type starting substrate 11, an $n^-$-type epitaxial layer doped with, for example, about $1.8\times10^{16}/cm^3$ of nitrogen is grown and forms the $n^-$-type drift region 12.

The thickness of the $n^+$-type starting substrate 11 that forms the $n^+$-type cathode region may be, for example, about 350 μm. The thickness of the $n^-$-type epitaxial layer that forms the $n^-$-type drift region 12 may be, for example, about 6 μm. By the processes up to here, the semiconductor substrate (semiconductor wafer) 30 in which the $n^-$-type epitaxial layer that forms the $n^-$-type drift region 12 is stacked on the front surface of the $n^+$-type starting substrate 11 is fabricated. As described above, the surface of the $n^-$-type drift region 12 is the front surface of the semiconductor substrate 30 while the back surface of the $n^+$-type starting substrate 11 is the back surface of the semiconductor substrate 30.

Figure 9:
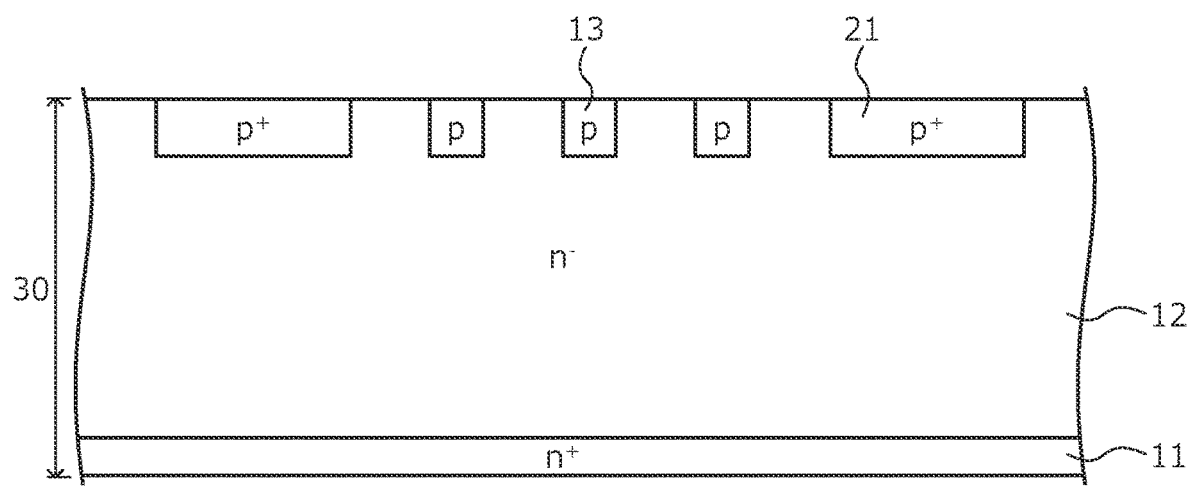
FIG. 9 is a cross-sectional view of a state of the silicon carbide semiconductor device according to the embodiment during manufacture.

Next, as depicted in FIG. 9, by photolithography and a first ion-implantation of a p-type impurity such as aluminum, in the active region 10 (refer to FIGS. 1 and 3), at least one p-type region 13 configuring a JBS structure is formed selectively in a surface region of the front surface of the semiconductor substrate 30 and the FLR 21 is formed (step S1 (part 1)). In FIG. 9, for simplicity, a fewer number (here, 3) of the p-type regions 13 is depicted as compared to in FIG. 1 (similarly in FIGS. 10 to 18). The p-type regions 13 are disposed at equal intervals, for example, about 2 μm intervals, along a direction parallel to the front surface of the semiconductor substrate 30.

Here, the first ion-implantation is performed in the $n^-$-type epitaxial layer (the $n^-$-type drift region 12) from the front surface of the semiconductor substrate 30 while the semiconductor substrate 30 is heated at a temperature of, for example, about 500 degrees C. In the first ion-implantation, for example, a p-type impurity is ion-implanted in multiple stages at differing acceleration energies in a range from about 30 keV to 350 keV so that the impurity concentration becomes about $2\times10^{19}/cm^3$ and has a box-profile from the front surface of the semiconductor substrate 30 to a depth of 500 nm.

Figure 10:
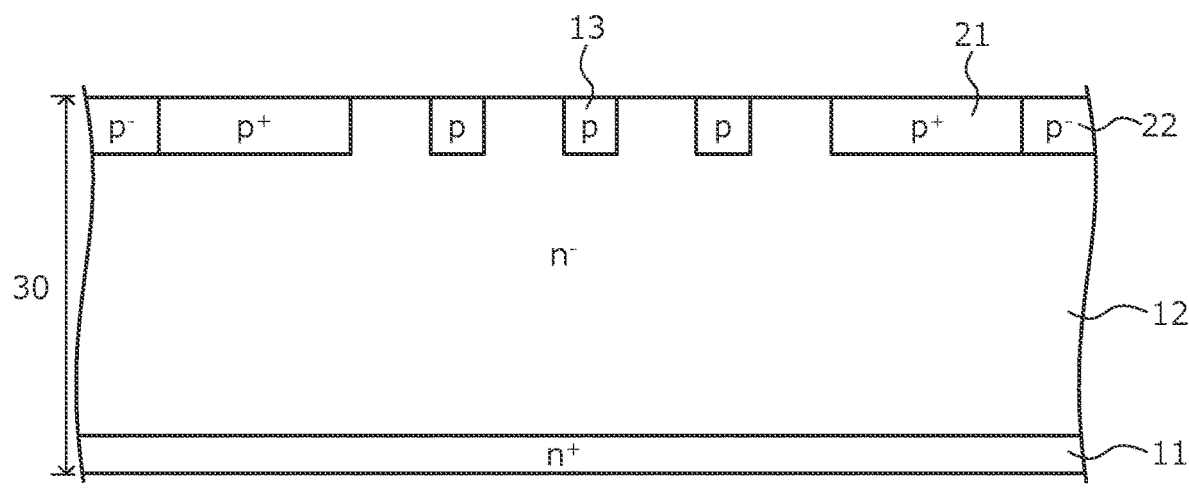
FIG. 10 is a cross-sectional view of a state of the silicon carbide semiconductor device according to the embodiment during manufacture.

Next, as depicted in FIG. 10, a process including photolithography and a second ion-implantation of an impurity as one set is repeatedly performed under differing conditions to selectively form the p-type regions (the p⁻-type region 22 and the p⁻⁻-type region 23) configuring the JTE structure, and the n⁺-type channel stopper region 24 (refer to FIG. 3) in surface regions of the front surface of the semiconductor substrate 30, in the edge termination region 20 (refer to FIG. 3) (step S1 (part 2)). The second ion-implantation, for example, similarly to the first ion-implantation, is divided into multiple stages so that the impurity distribution has a box-profile.

Figure 11:
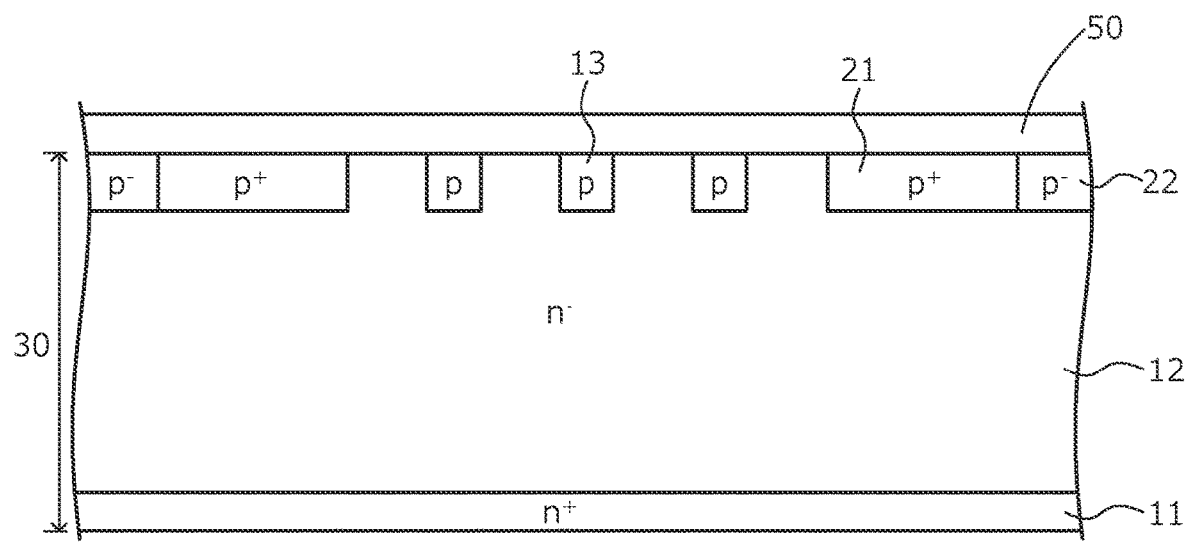
FIG. 11 is a cross-sectional view of a state of the silicon carbide semiconductor device according to the embodiment during manufacture.

Next, as depicted in FIG. 11, an entire area of the front surface of the semiconductor substrate 30, for example, is covered and protected by a carbon (C) protective film 50 and thereafter, the impurities implanted by the first and the second ion-implantations are activated by a heat treatment (step S2). In the process at step S2, for example, the semiconductor substrate 30 is inserted in a processing furnace of heat treatment equipment, the processing furnace is evacuated to a pressure that is at most about $1\times10^{-2}$ Pa and thereafter, argon (Ar) gas is introduced into the processing furnace and a heat treatment at a temperature of about 1700 degrees C. is performed for about five minutes in an atmosphere having a pressure of about $1\times10^{5}$ Pa.

Figure 12:
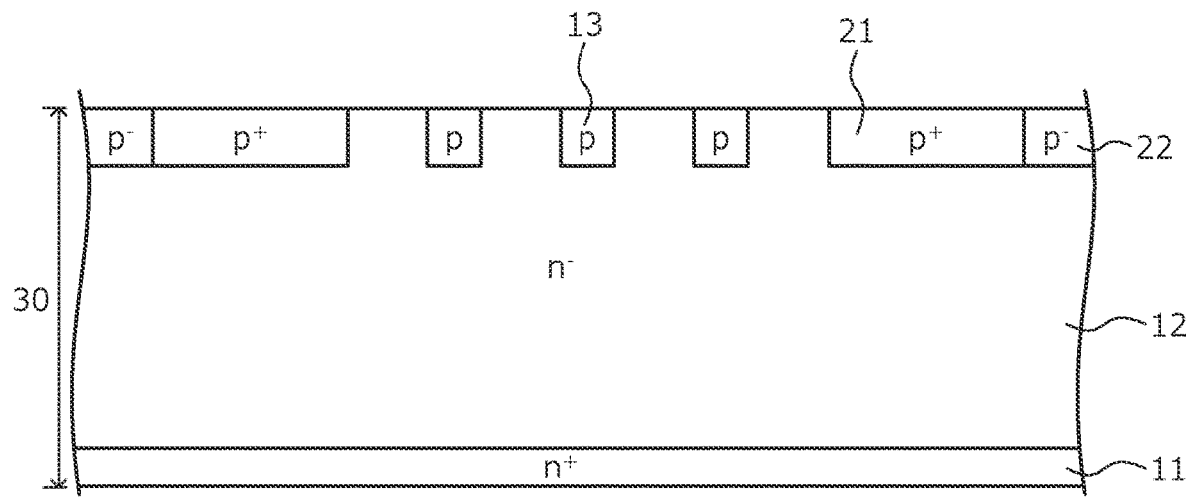
FIG. 12 is a cross-sectional view of a state of the silicon carbide semiconductor device according to the embodiment during manufacture.

Next, as depicted in FIG. 12, for example, ashing equipment is used to remove the carbon protective film 50 by ashing. For example, reactive ion etching (RIE) equipment is used for the ashing equipment. In the processing furnace of the RIE equipment, an oxygen ($O_2$) gas atmosphere at a pressure of about 6 Pa is established and thereafter, high frequency (radio frequency (RF)) energy of about 500 W is applied and the carbon protective film 50 is removed by about five minutes of ashing under a plasmatized oxygen gas atmosphere.

Figure 13:
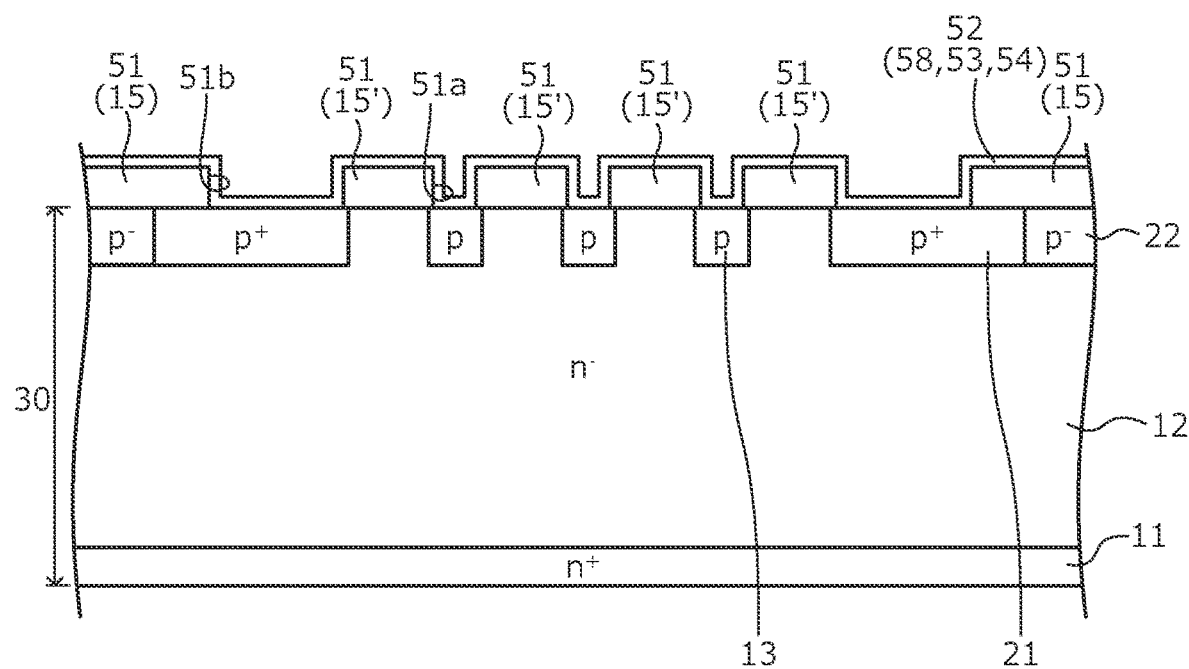
FIG. 13 is a cross-sectional view of a state of the silicon carbide semiconductor device according to the embodiment during manufacture.

Next, as depicted in FIG. 13, an oxide film 51 is formed on an entire area of the front surface of the semiconductor substrate 30 (step S3). Next, the oxide film 51 is selectively removed by photolithography and etching to form openings (first and second openings) 51*a*, 51*b* (step S4). In the process at step S4, the openings 51*a* that respectively expose the p-type regions 13 and the single opening 51*b* that exposes, in a substantially rectangular shape surrounding a periphery of the active region 10, a center-side part of the FLR 21 facing the center of the semiconductor substrate 30 are formed the oxide film 51.

By the process at step S4, of the oxide film 51, parts 15' covering the n⁻-type drift region 12 in the active region 10 and a part forming the field oxide film 15 in the edge termination region 20 are left. After the process at step S4, all of the oxide film 51 including the part forming the field oxide film 15 becomes an oxide film mask used to form the nickel silicide films 33 in a process described hereinafter. Of the oxide film 51, the parts 15' covering the n⁻-type drift region 12 in the active region 10 are not left in the product.

In other words, in the process at step S4, the field oxide film 15 and the oxide film mask used to form the nickel silicide films 33 are formed concurrently. Therefore, the oxide film 51 has the same stacked structure as that of the field oxide film 15. In particular, the oxide film 51, for example, is a stacked oxide film that has a thickness of about 500 nm and in which the thermal oxide film 16 and the deposited oxide film 17 (refer to FIG. 3) are sequentially stacked by a thermal oxidation method and a chemical vapor deposition (CVD) method.

The process at step S4 suffices to be performed by dry etching that has high dimensional precision. As a result, the p-type regions 13 and the FLR 21 may be exposed with dimensional precision. Further, of the sidewalls of the opening 51*b* of the oxide film 51, an outer sidewall nearest the ends of the semiconductor substrate 30 is the sidewall of the contact hole 15*a* of the field oxide film 15. Therefore, performing the process at step S4 by dry etching enables formation of the contact hole 15*a* of the field oxide film 15 with dimensional precision.

When the openings 51*a* are formed by dry etching, the openings 51*a* are formed in the shape shown in FIG. 19. As depicted in FIG. 19, the openings 51*a* have a tapered shape in which the bottom is narrower than the surface and an angle θ formed by one of the sidewalls of one of the openings 51*a* and the surface of one of the p-type regions 13 is in a range from 80 degrees to 90 degrees. Here, while description has been given relative to the openings 51*a*, description is similar for the opening 51*b*.

Next, for example, from the surface of the oxide film 51 and spanning the front surface (surface) of the semiconductor substrate 30, the metal material film 52 is formed on said surfaces in the openings 51*a*, 51*b* of the oxide film 51 by a sputtering method (step S5). The metal material film 52 is a stacked metal film in which a first nickel film 58, an aluminum film (metal film containing aluminum) 53, and a second nickel film 54 are sequentially stacked (FIG. 20). In FIG. 13, the first nickel film 58, the aluminum film 53, and the second nickel film 54 are collectively depicted as the metal material film 52 of a single layer. In the description below, while the metal material film 52 having a three-layer structure will be described, the metal material film 52 may be a two-layer stacked metal film in which the aluminum film 53 and the second nickel film 54 are sequentially stacked.

Here, in a silicon carbide semiconductor device, it is known that to reduce the contact resistance with the p-type regions (the p-type regions 13 configuring the JBS structures, the field limiting ring 21), an aluminum film is formed as the ohmic electrodes. However, with aluminum alone, the alloy reaction was vigorous and after heat treatment, surface condensation occurred. Other than aluminum, while it is possible to reduce the contact resistance with the p-type regions by using a nickel silicide, there was a limit to the extent that sheet resistance was reduced.

Therefore, when the stacked metal film in which the aluminum film and the nickel film are sequentially stacked is used and the silicon carbide and the nickel are converted into a silicide, excess carbon and aluminum react, forming $Al_3C$, whereby reduction of the sheet resistance was possible. Further, similarly to conversion to a nickel silicide, by performing two-stage sintering, formation by self-alignment was possible.

However, in the stacked metal film in which the aluminum film and the nickel film are sequentially stacked, condensation of aluminum occurs on the surface of the semiconductor substrate and therefore, there is an upper limit for the temperature of the first-stage of sintering and the thickness of the generated silicide layer is limited. Further, at subsequent processes, part of the silicide layer disappears.

Thus, in the method of manufacturing the silicon carbide semiconductor device according to the embodiment, the stacked metal film in which the first nickel film 58, the aluminum film 53, and the second nickel film 54 are sequentially stacked is used. The first nickel film 58 is a film that suppresses aluminum from condensing on the surface of the semiconductor substrate 30 during a heat treatment at step S6 described hereinafter and, for example, has a thickness t3 of about 80 nm. When the first nickel film 58 is not used, the aluminum film 53 is in contact with the semiconductor substrate 30 and a Al—Ni—Si compound (compound layer) 55 described hereinafter cannot be formed uniformly spanning an entire area of the front surface of the semiconductor substrate 30. The aluminum film 53 has a thickness t1 of, for example, about 80 nm.

The second nickel film 54 is a cap film that prevents melting of the aluminum film 53 during the heat treatment at step S6 described hereinafter and, for example, has a thickness t2 of about 50 nm. The cap film is used for the following reasons. When the cap film is not used, the aluminum film 53 that melts during the heat treatment at step S6 becomes granular and partially contacts the semiconductor substrate 30. In this case, the Al—Ni—Si compound (compound layer) 55 described hereinafter cannot be formed uniformly spanning the entire area of the front surface of the semiconductor substrate 30.

Figure 14:
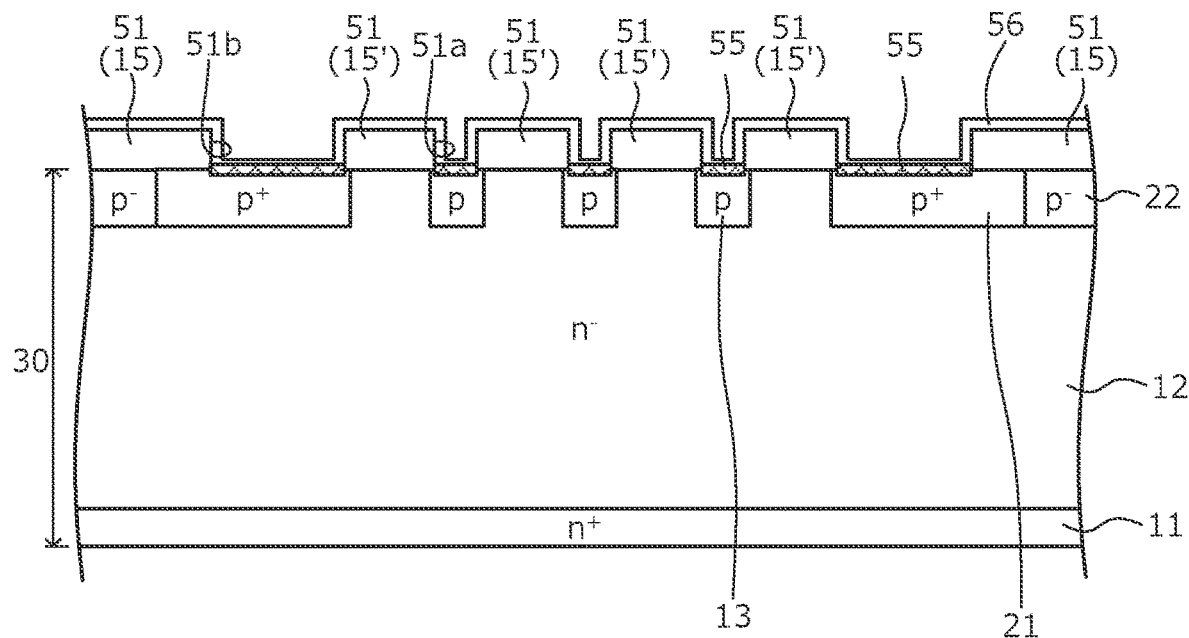
FIG. 14 is a cross-sectional view of a state of the silicon carbide semiconductor device according to the embodiment during manufacture.

Subsequently, by a heat treatment, the metal material film 52 is sintered by a first sintering (sintering) (step S6), thereby generating the aluminum-nickel-silicon (Al—Ni—Si) compound 55 in the openings 51a, 51b of the oxide film 51 (refer to FIG. 14). A mechanism by which the Al—Ni—Si compound 55 is generated by this process (the first sintering) will be described in detail using FIGS. 20 to 22.

In FIG. 20, only a contact region between the metal material film 52 and the semiconductor substrate 30 in the openings 51a, 51b of the oxide film 51 is depicted and other parts are not depicted (similarly in FIGS. 21 and 22). In FIG. 20, while the state of the oxide film 51 in one of the openings (51a, 51b) is depicted, the state of the oxide film 51 in all of the openings 51a, 51b is similar to the state depicted in FIG. 18.

By the heat treatment at step S6, in the contact region between the metal material film 52 and the semiconductor substrate 30 in the openings 51a, 51b of the oxide film 51, silicon atoms in the semiconductor substrate 30 thermally diffuse into the aluminum film 53 (thermal diffusion 61). Aluminum atoms in the aluminum film 53 thermally diffuse into the first nickel film 58 and the second nickel film 54 (thermal diffusion 62). Nickel atoms in the first nickel film 58 thermally diffuse into the semiconductor substrate 30 (thermal diffusion 63), and nickel atoms in the second nickel film 54 thermally diffuse into the aluminum film 53 (thermal diffusion 64) (FIG. 21).

By the thermal diffusion 62 of aluminum atoms into the second nickel film 54 and the thermal diffusion 64 of nickel atoms into the aluminum film 53, on the front surface of the semiconductor substrate 30 and on the surface of the oxide film 51 in the openings 51a, 51b of the oxide film 51, an aluminum-nickel (AlNi) compound 56 is generated. Further, by the thermal diffusion 62 of aluminum atoms into the first nickel film 58, the thermal diffusion 63 of the nickel atoms into the semiconductor substrate 30, and the thermal diffusion 61 of the silicon atoms into the first nickel film 58 and into the aluminum film 53, the Al—Ni—Si compound 55 is generated in the contact region between the metal material film 52 and the semiconductor substrate 30 (FIG. 22).

The Al—Ni—Si compound 55 is generated by a reaction between the metal material film 52 and low-impurity-concentration parts of the p-type regions 13 and of the FLR 21, the p-type regions 13 and the FLR 21 being diffused regions formed by ion implantation, and the low-impurity-concentration parts being from the front surface of the semiconductor substrate 30 to a shallow depth position of a depth in a range from about 20 nm to 30 nm. Therefore, a compound layer containing the Al—Ni—Si compound 55 is formed in the openings 51a, 51b of the oxide film 51 by self-alignment using the oxide film 51 as a mask so as to be embedded in the semiconductor substrate 30 in the depth direction.

Further, the Al—Ni—Si compound 55 is in contact with a part that is present at a depth position deeper from the front surface of the semiconductor substrate 30 than is a depth position of the low-impurity-concentration part of the p-type region 13 or the FLR 21 in which the Al—Ni—Si compound 55 itself is embedded, said part having an impurity concentration higher than that of the low-impurity-concentration part. The Al—Ni—Si compound 55 forms an ohmic contact having low resistance with the high impurity concentration in the p-type regions 13 or the FLR 21.

In the Al—Ni—Si compound 55, remaining carbon (C) (hereinafter, excess carbon) in the semiconductor substrate 30 may be caused, by a silicide reaction between the Al—Ni—Si compound 55 and the semiconductor substrate 30, to be deposited to an extent so as to not form a layer. The excess carbon is the carbon atoms left in the semiconductor substrate 30 as a result of the silicon atoms in the semiconductor substrate 30 being consumed in the silicide reaction above. In particular, in the Al—Ni—Si compound 55, excess carbon may be deposited and distributed as granules.

With consideration of chemical reaction uniformity, a period of the heat treatment at step S6 suffices to be, for example, at least two minutes and with consideration of product yield, for example, may be at most about one hour. The heat treatment at step S6 may be in a range, for example, from about 500 degrees C. to 700 degrees C. The heat treatment at step S6, for example, is performed for ten minutes at 600 degrees C. A reason for this is as follows. When the temperature of the heat treatment at step S6 exceeds 700 degrees C., the aluminum-nickel compound 56 enters and reacts with the oxide film 51 that is a silicon oxide ($SiO_2$) film and when the reaction further progresses, a nickel silicide is formed in the Schottky regions. At step S7, a subsequent step of removing excess metal (excess part), the nickel silicide films 33 and therefore, this product remains in the field oxide film 15 and on the Schottky regions and this product causes leak failure during reverse bias.

When the temperature of the heat treatment at step S6 is less than 400 degrees C., the above reaction between the semiconductor substrate 30 and the metal material film 52 does not occur and therefore, the metal material film 52 is not used and in the process at subsequent step S7, the metal material film 52 is entirely removed. Further, when the temperature of the heat treatment at step S6 is less than 600 degrees C., the aluminum atoms in the aluminum film 53 are not thermally diffused into the semiconductor substrate 30. The heat treatment at step S6, for example, may be performed by a heat treatment furnace for which management of the temperature of the heat treatment to be uniform is easy. The temperature being uniform means a substantially constant temperature within a range that includes an allowable error due to process variation. The foregoing is a detailed description regarding the first sintering.

Figure 15:
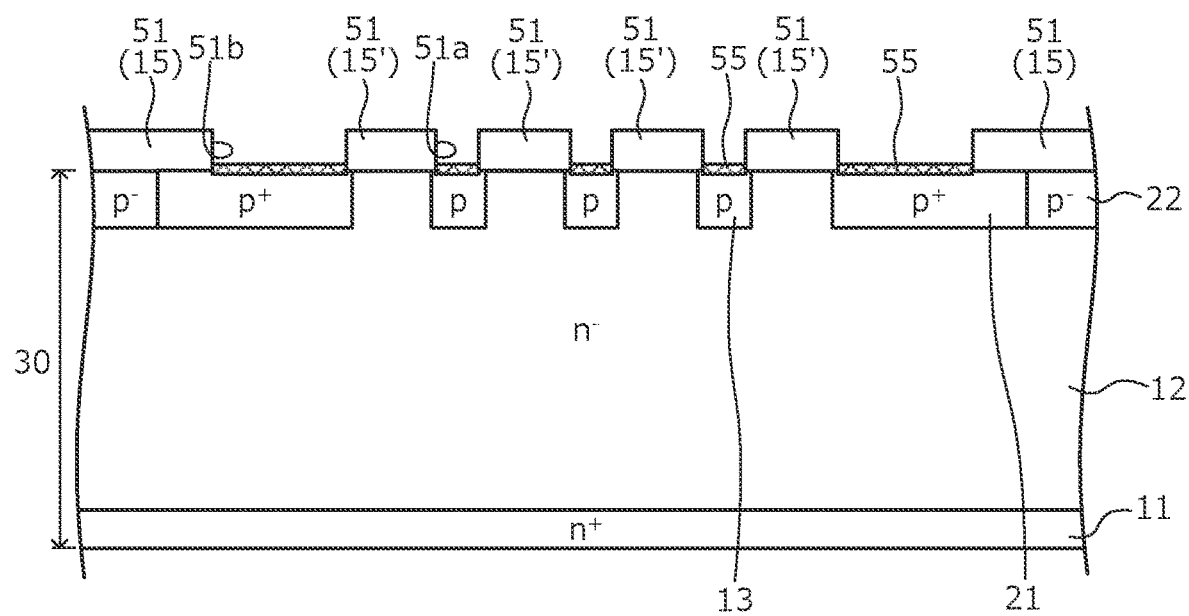
FIG. 15 is a cross-sectional view of a state of the silicon carbide semiconductor device according to the embodiment during manufacture.

Next, as depicted in FIG. 15, excess metal (excess parts) on the oxide film 51 and in the openings 51a, 51b of the oxide film 51 is removed (step S7). The excess metal is metal generated from the metal material film 52 that is unreacted and the metal material film 52, excluding the Al—Ni—Si compound 55, and particularly, is the aluminum-nickel compound 56 that did not contribute to the generation of the Al—Ni—Si compound 55. In the process at step S7, for example, an entire area of the front surface of the semiconductor substrate 30 is etched by wet etching using phosphorus nitric acid. By the process at step S7, the Al—Ni—Si compound 55 is left in each of the openings 51a, 51b of the oxide film 51.

Figure 16:
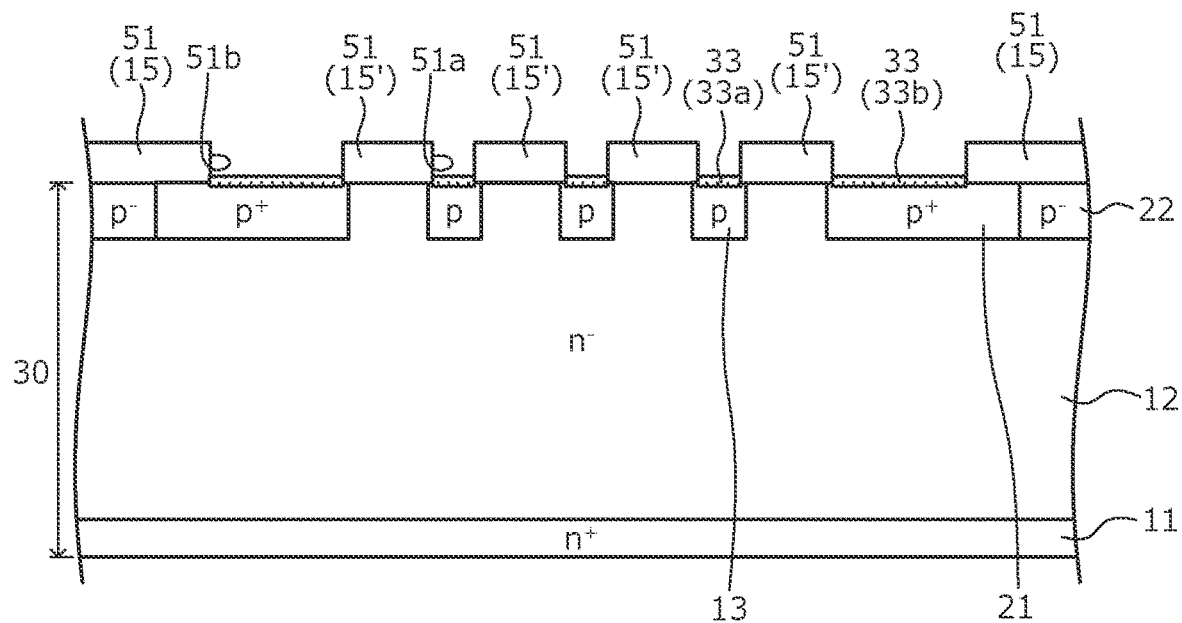
FIG. 16 is a cross-sectional view of a state of the silicon carbide semiconductor device according to the embodiment during manufacture.

Next, as depicted in FIG. 16, by a heat treatment, the Al—Ni—Si compound 55 is sintered by a second sintering (step S8). By the heat treatment at step S8, a nickel silicide is generated in the Al—Ni—Si compound 55, whereby the Al—Ni—Si compound 55 forms the nickel silicide films 33 in ohmic contact with the semiconductor substrate 30. As a result, in each of the openings 51a, 51b of the oxide film 51, the nickel silicide films 33 that are in ohmic contact with the semiconductor substrate 30 are formed by self-alignment using the oxide film 51 as a mask.

The temperature of the heat treatment at step S8, for example, may be a temperature that is higher than the temperature of the heat treatment at step S6. The temperature of the heat treatment at step S8, for example, may be in a range from at least about 900 degrees C., which is the temperature at which the nickel silicide is generated in the Al—Ni—Si compound 55, to at most, for example, about 1100 degrees C., which is the temperature enabling low-cost processing using a vertical heat treatment furnace. The heat treatment at step S8, for example, is performed for ten minutes at 975 degrees C. The heat treatment at step S8, for example, may be performed using a heat treatment furnace that enables management of the temperature of the heat treatment to be uniform.

Figure 17:
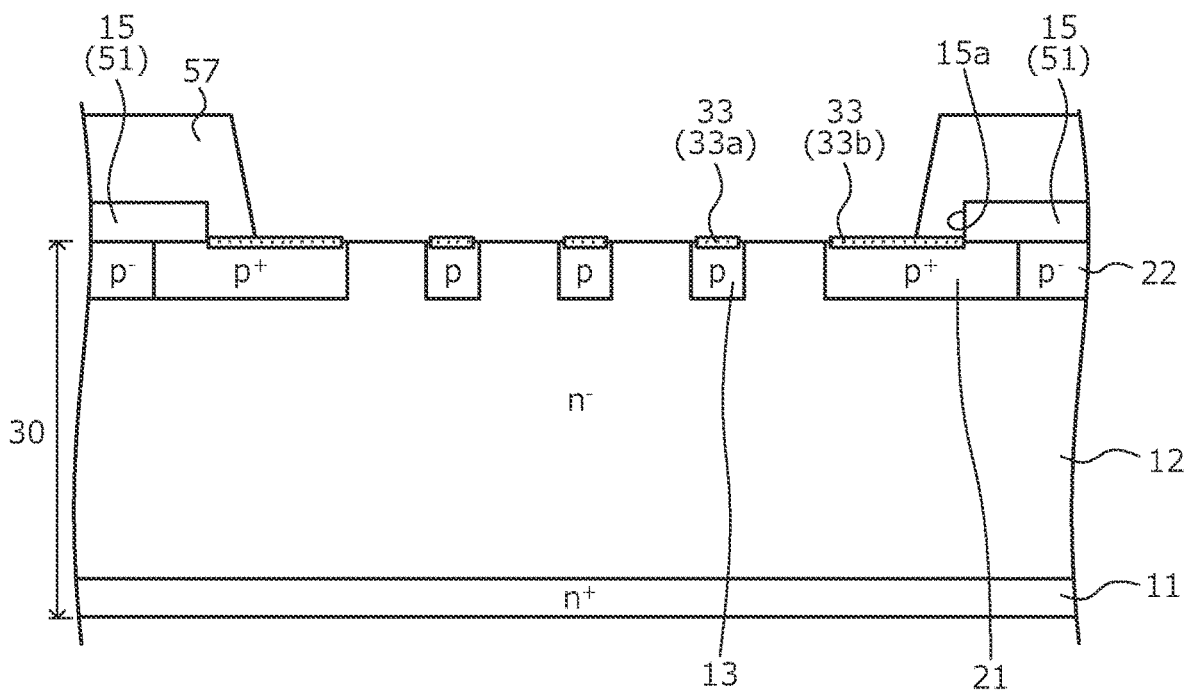
FIG. 17 is a cross-sectional view of a state of the silicon carbide semiconductor device according to the embodiment during manufacture.

Next, as depicted in FIG. 17, by photolithography, a resist film 57 having an opening corresponding to the contact hole 15a of the field oxide film 15 is formed. Next, etching is performed using the resist film 57 as a mask, thereby forming the contact hole 15a that penetrates the field oxide film 15 in the depth direction (step S9). In the process at step S9, of the oxide film 51, only the part forming the field oxide film 15 is left.

In the process at step S9, of the oxide film 51, the part 15' covering the n⁻-type drift region 12 in the active region 10 is entirely removed, thereby connecting all of the openings 51a, 51b of the oxide film 51, whereby the contact hole 15a that was already formed in the process at step S4 appears. During the process at step S9, the entire outer sidewall of the opening 51b of the oxide film 51 is completely covered by the resist film 57 and therefore, the outer sidewall of the opening 51b of the oxide film 51 is not etched.

In the contact hole 15a of the field oxide film 15, an entire area of the surface of the active region 10 and an entire area of the surface of the connecting region 20a of the edge termination region 20 are exposed. As a result, in the contact hole 15a of the field oxide film 15, all of the nickel silicide films 33 (33a, 33b) and a part of the n⁻-type drift region 12 between adjacent nickel silicide films 33 of the nickel silicide films 33 are exposed.

When the widths w2a, w2b of the first and the second nickel silicide films 33a, 33b are less than the width w1 of the p-type regions 13 and less than the width w3 of the connecting region 20a of the edge termination region 20, respectively, in the contact hole 15a of the field oxide film 15, parts of the surfaces of the p-type regions 13 and a part of the FLR 21 not bonded to the nickel silicide films 33 are further exposed.

The process at step S9 may be performed by wet etching. When the process at step S9 is performed by dry etching, plasma damage due to the dry etching may be left on the front surface of the semiconductor substrate 30. Even when the process at step S9 is performed by wet etching, the contact hole 15a may be formed in the field oxide film 15 with dimensional precision. A reason is that during the process at step S4, the outer sidewall of the opening 51b formed with dimensional precision in the oxide film 51 by dry etching configures the sidewall of the contact hole 15a of the field oxide film 15.

In the process at step S4, of the oxide film 51, the parts 15' covering the n⁻-type drift region 12 and the part forming the field oxide film 15 are left (refer to FIG. 13). Therefore, after the process at step S4, of the oxide film 51, the parts 15' covering the n⁻-type drift region 12 are left in the contact hole 15a of the field oxide film 15 and the outer sidewall of the opening 51b of the oxide film 51 configures the sidewall of the contact hole 15a of the field oxide film 15. The entire outer sidewall of the opening 51b of the oxide film 51 is completely covered by the resist film 57 during the process at step S9 and is not etched. Therefore, in the process at step S4 and subsequent processes, the position of the outer sidewall of the opening 51b of the oxide film 51 does not change.

In this manner, dimensional precision of the contact hole 15a of the field oxide film 15 is the same as the dimensional precision of the opening 51b of the oxide film 51 formed by the dry etching and is not dependent on the dimensional precision of the wet etching in the process at step S9. Further, in the process at step S4 and subsequent processes, the position of the outer sidewall of the opening 51b of the oxide film 51 does not change and the second nickel silicide film 33b formed by self-alignment using the oxide film 51 as a mask is maintained in contact with the outer sidewall of the opening 51b of the oxide film 51, even after the process at step S9. In other words, the second nickel silicide film 33b is maintained in contact with the field oxide film 15 at the sidewall of the contact hole 15a, even after the process at step S9.

Figure 18:
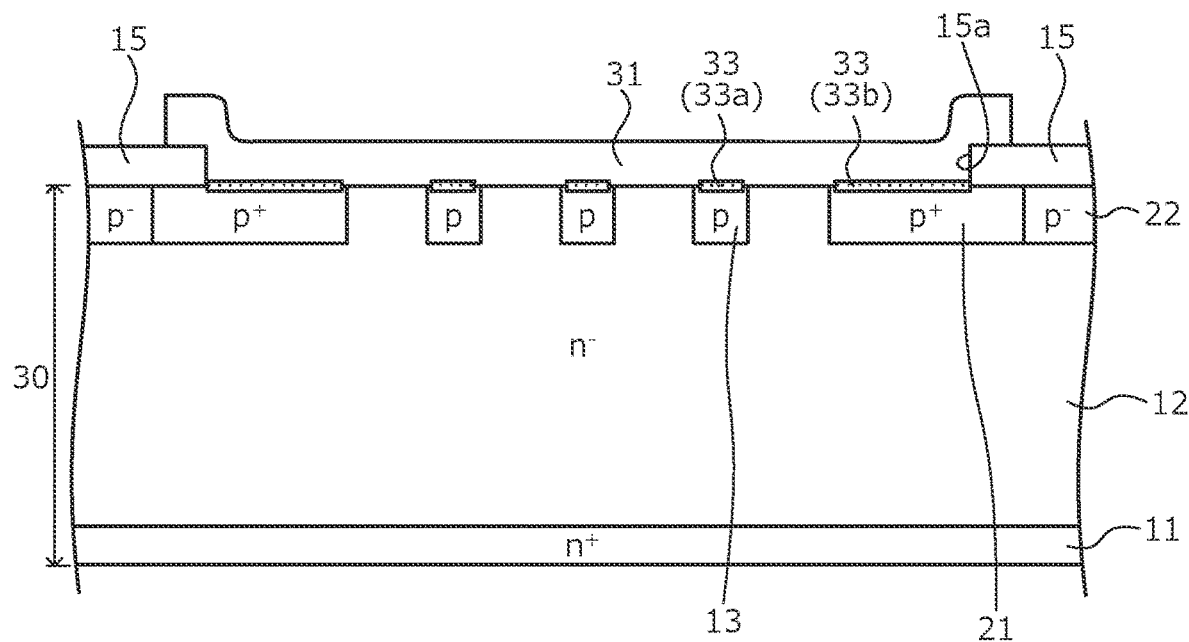
FIG. 18 is a cross-sectional view of a state of the silicon carbide semiconductor device according to the embodiment during manufacture.

Next, as depicted in FIG. 18, for example, by physical vapor deposition (PVD) such as sputtering, the titanium film 31 is formed from the surface of the field oxide film 15, to an entire area of the front surface of the semiconductor substrate 30 in the contact hole 15a. Next, by photolithography and etching, the titanium film 31 is left in the contact hole 15a (step S10). The thickness of the titanium film 31 may be, for example, about 100 nm. The titanium film 31 may extend from inside the contact hole 15a onto the field oxide film 15.

Next, by a heat treatment, for example, at a temperature of about 500 degrees C. for about ten minutes, the titanium film 31 is sintered. By the heat treatment, the Schottky junctions between the titanium film 31 and the n⁻-type drift region 12 are formed. Next, for example, by physical vapor deposition such as sputtering, the aluminum alloy film having a thickness of, for example, about 5 μm is formed from the surface of the titanium film 31, to an entire area of the surface of the field oxide film 15. Next, by photolithography and etching, the aluminum alloy film is selectively removed to be left on the surface of the titanium film 31 as the aluminum alloy film 32 that forms the front electrode 14.

Next, the front surface of the semiconductor substrate 30 (semiconductor wafer) is covered and protected by a protective film (not depicted) and thereafter, the semiconductor substrate 30 is ground from the back side, whereby the thickness of the semiconductor substrate 30 is reduced to a product thickness. Next, for example, by physical vapor deposition such as sputtering, nickel or titanium is deposited on an entire area of the back surface of the semiconductor substrate 30 (the back surface of the n⁺-type starting substrate 11) and thereafter, the back electrode 19 is formed by laser annealing (step S11). Thereafter, the protective film on the front surface of the semiconductor substrate 30 is removed and subsequently, the semiconductor substrate 30 is diced (cut) into individual chips, whereby the silicon carbide semiconductor device 40 depicted in FIGS. 1 to 3 is completed.

Figure 23:
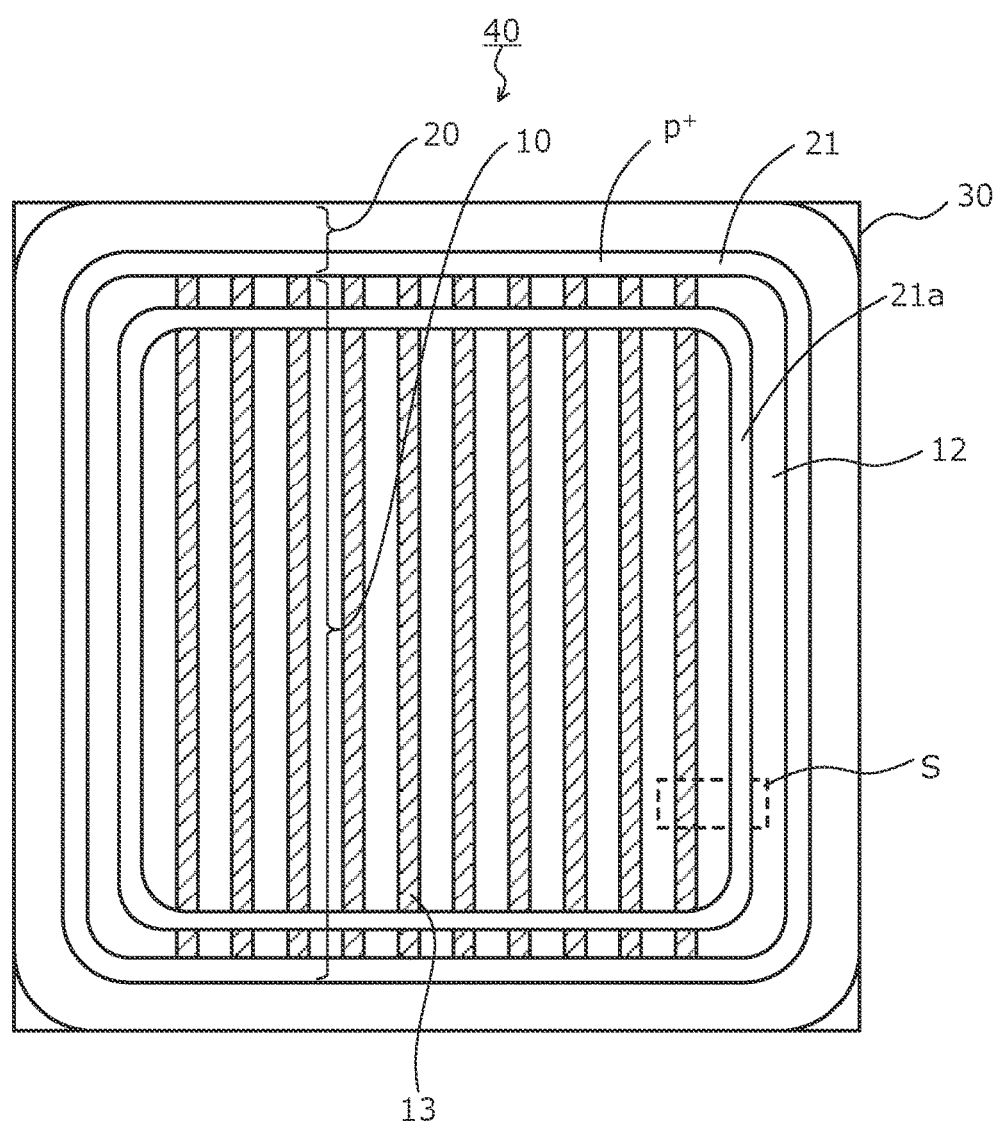
FIG. 23 is a plan view of another layout of the silicon carbide semiconductor device according to the embodiment as viewed from the front side of the semiconductor substrate.
Figure 24:
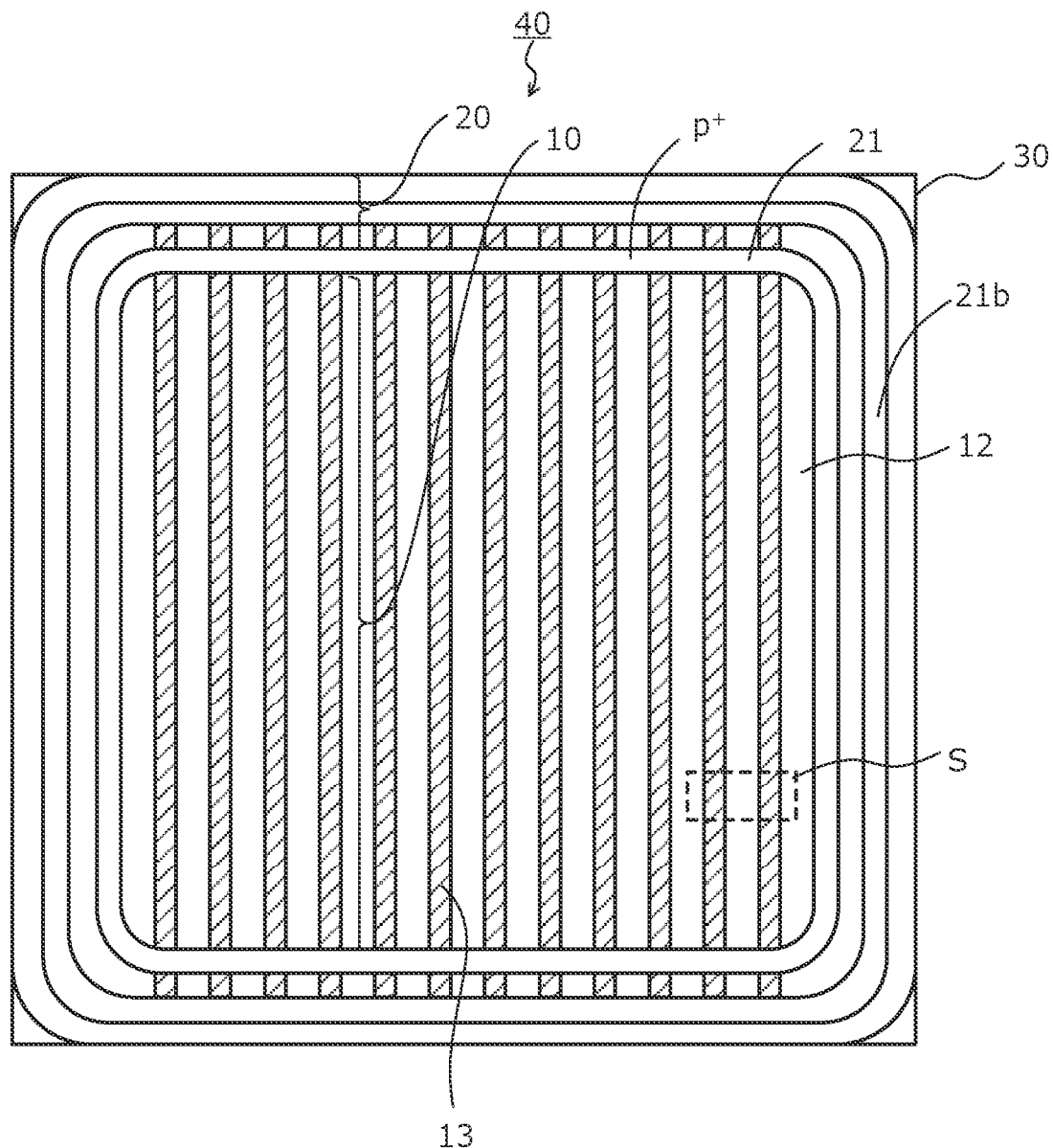
FIG. 24 is a plan view of another layout of the silicon carbide semiconductor device according to the embodiment as viewed from the front side of the semiconductor substrate.
Figure 25:
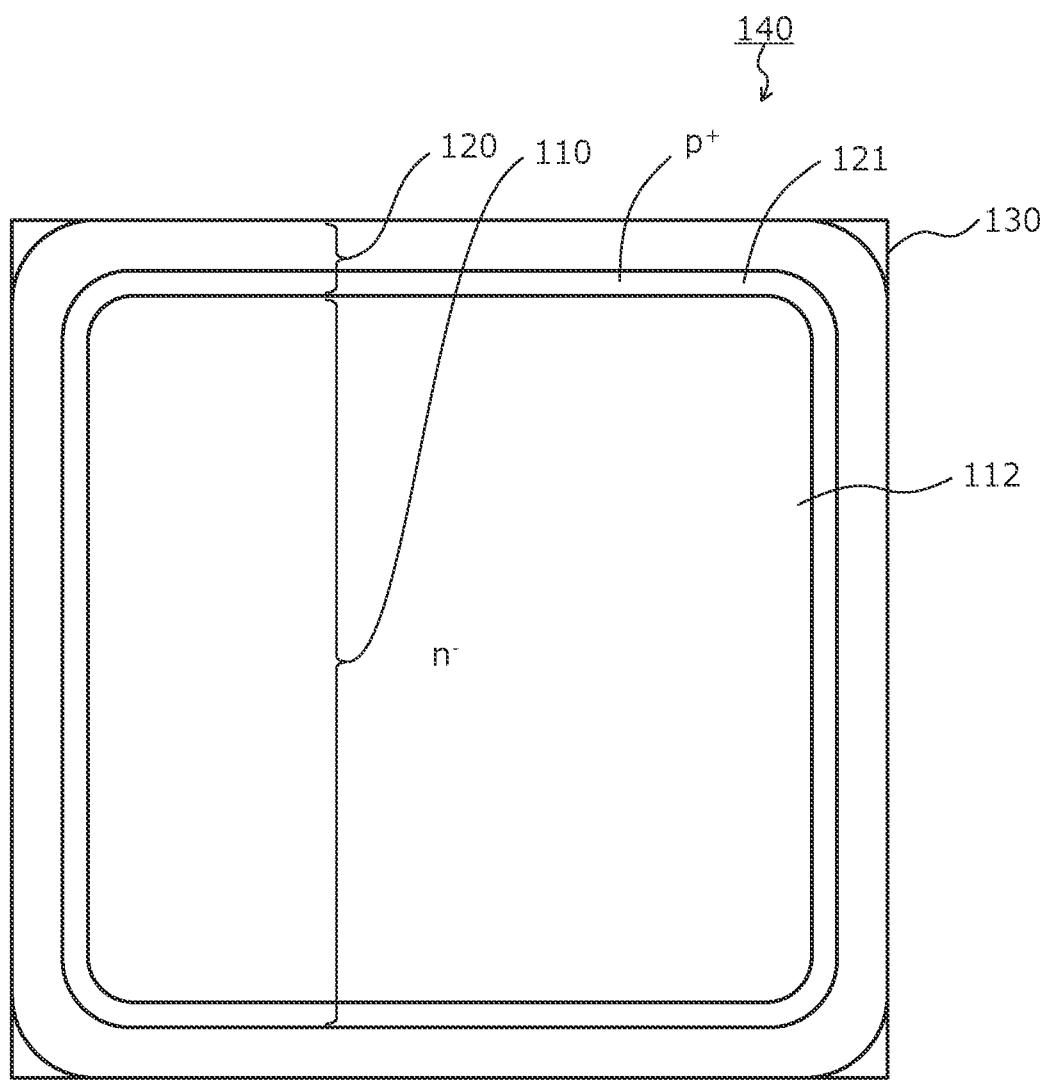
FIG. 25 is a plan view of a conventional silicon carbide semiconductor device as viewed from a front side of a semiconductor substrate.

FIGS. 23 and 24 are plan views of other layouts of the silicon carbide semiconductor device according to the embodiment as viewed from the front side of the semiconductor substrate. As depicted in FIGS. 23 and 24, the field limiting ring may include two concentric rings.

For example, as depicted in FIG. 23, on an inner peripheral side of the field limiting ring 21, an inner field limiting ring 21a may be provided. In this instance, the inner field limiting ring 21a is provided in the active region 10, and in a region between the field limiting ring 21 and the inner field limiting ring 21a, the n$^-$-type drift region 12 is provided between the p-type regions 13.

By providing the inner field limiting ring 21a, surge current may be dissipated and generated heat is dissipated, whereby local accumulation of heat may be prevented. Further, regions of the inner field limiting ring 21a parallel to the p-type regions 13 may have a function similar to that of the p-type regions 13.

Further, as depicted in FIG. 24, on an outer peripheral side of the field limiting ring 21, an outer field limiting ring 21b may be provided. In this instance, the outer field limiting ring 21b is provided in the edge termination region 20, and in a region between the field limiting ring 21 and the outer field limiting ring 21b, a p-type region (the p$^-$-type region 22 configuring the JTE structure, etc.) is provided between the p-type regions 13. In this configuration, the outer field limiting ring 21b is connected to the front electrode 14 via the p-type regions and the inner field limiting ring 21a.

By providing the outer field limiting ring 21b, electric field applied thereto is mitigated, thereby further enabling the breakdown voltage to be ensured.

As described above, according to the embodiment, Schottky regions each having a shape of a stripe and low-resistance ohmic regions each having a shape of a stripe are provided alternating one another, and between these, high-resistance non-operating regions are provided. As a result, the low-resistance ohmic regions may be formed without reducing the area of the Schottky regions, thereby enabling Vf characteristics to be maintained while IFSM characteristics are improved.

In the foregoing, the present invention is not limited to the embodiments described above and various modifications within a range not departing from the spirit of the invention are possible, and application to silicon carbide semiconductor devices that include ohmic electrodes in ohmic contact with p-type regions disposed in a predetermined pattern is possible.

In particular, for example, the present invention is useful for silicon carbide semiconductor devices configured to reduce the contact resistance between p-type regions (or p$^+$-type contact regions provided between the p-type regions and a main surface of the semiconductor substrate) and ohmic electrodes and is useful for silicon carbide semiconductor devices having a structure in which ohmic electrodes in ohmic contact with p-type regions are in contact with an oxide film.

According to the invention described above, Schottky regions each having a shape of a stripe and low-resistance ohmic regions each having a shape of a stripe are provided alternating one another, and between these, high-resistance non-operating regions are provided. As a result, the low-resistance ohmic regions may be formed without reducing the area of the Schottky regions, thereby enabling Vf to be maintained while IFSM are improved.

The silicon carbide semiconductor device and the method of manufacturing a silicon carbide semiconductor device according to the invention achieve an effect in that formation of low-resistance ohmic electrodes enables low Vf characteristics to be maintained while surge current capability is increased.

As described above, the silicon carbide semiconductor device and the method of manufacturing a silicon carbide semiconductor device according to the invention are useful for power semiconductor devices used in power converting equipment and in power converting devices of various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having, in a plan view thereof, an active region and a termination region surrounding a periphery of the active region, the silicon carbide semiconductor device comprising:
    a semiconductor substrate containing silicon carbide and having a first main surface and a second main surface;
    a first-conductivity-type region provided in the semiconductor substrate, and exposed at the first main surface of the semiconductor substrate;
    a plurality of first second-conductivity-type regions selectively provided in the active region, the first second-conductivity-type regions being formed in the semiconductor substrate at the first main surface thereof and being in contact with the first-conductivity-type region;
    a plurality of silicide films respectively in ohmic contact with the plurality of first second-conductivity-type regions;
    a first electrode, which is in contact with the plurality of silicide films to form a plurality of ohmic regions, in contact with the plurality of first second-conductivity-type regions to form a plurality of non-operating regions, and in contact with the first-conductivity-type region to form a plurality of Schottky regions;
    a second electrode provided at the second main surface of the semiconductor substrate; and
    a second second-conductivity-type region provided in the termination region, surrounding the active region, wherein
    the ohmic regions, the non-operating regions, and the Schottky regions are formed in the active region and are provided in a striped pattern, and
    the second second-conductivity-type region connects the ohmic regions and the non-operating regions in the termination region.

2. The silicon carbide semiconductor device according to claim 1, wherein
    the ohmic regions include a plurality of stripe-shaped regions separate from one another in the active region.

3. The silicon carbide semiconductor device according to claim 1, wherein
    a contact resistance of each ohmic region with a corresponding one of the silicide films and with the first electrode is at most $5.0 \times 10^{-3}$ $\Omega$cm$^2$.

4. The silicon carbide semiconductor device according to claim 1, wherein
    a contact resistance of each ohmic region with a corresponding one of the silicide films and with the first electrode is at most $5.0 \times 10^{-4}$ $\Omega$cm$^2$.

5. The silicon carbide semiconductor device according to claim 1, wherein
each of the silicide films contains nickel, silicon, and aluminum.

6. The silicon carbide semiconductor device according to claim 1, wherein
each of the ohmic regions and the Schottky regions are in contact with one of the non-operating regions.

7. The silicon carbide semiconductor device according to claim 1, wherein
each of the ohmic regions has a width that is at most 2 μm.

8. A method of manufacturing a silicon carbide semiconductor device having, in a plan view thereof, an active region and a termination region surrounding a periphery of the active region, the method comprising:
providing a semiconductor substrate containing silicon carbide, the semiconductor substrate having a first main surface and a second main surface;
forming a first-conductivity-type region in the semiconductor substrate, a surface of the first-conductivity-type region forming the first main surface of the semiconductor substrate;
selectively forming a plurality of first second-conductivity-type regions in the active region, the plurality of first second-conductivity-type regions being formed in the semiconductor substrate at the first main surface thereof, and being in contact with the first-conductivity-type region;
forming a second second-conductivity-type region in the termination region, surrounding the active region;
forming an oxide film on the first main surface of the semiconductor substrate, covering the first-conductivity-type region and the first second-conductivity-type regions;
forming a plurality of openings in the oxide film, to thereby expose the first second-conductivity-type regions, by selectively removing the oxide film;
forming a metal material film in the openings of the oxide film and in contact with first main surface of the semiconductor substrate, by sequentially stacking a first nickel film, an aluminum film, and a metal film having a melting point higher than that of aluminum;
generating a compound layer on the first main surface of the semiconductor substrate through a first heat treatment that causes the metal material film and the semiconductor substrate to react, to thereby form the compound layer by self-alignment in the openings of the oxide film using the oxide film as a mask;
removing an excess part of the metal material film excluding the compound layer;
generating a nickel silicide in the compound layer to form a silicide film in ohmic contact with the semiconductor substrate, by a second heat treatment at a temperature higher than that of the first heat treatment;
forming a contact hole connecting the openings by removing the oxide film in the active region after forming the silicide film;
forming a first electrode on the first main surface of the semiconductor substrate in the contact hole, by sequentially stacking a titanium film and a metal electrode film containing aluminum, the first electrode being in contact with the first-conductivity-type region to form a plurality of Schottky regions, in contact with the silicide film to form a plurality of ohmic regions, and in contact with the first second-conductivity-type regions to form a plurality of non-operating regions; and
forming a second electrode on the second main surface of the semiconductor substrate, wherein
each of the openings is formed to have a width that is smaller than a width of each of the first second-conductivity-type regions, and
the ohmic regions, the non-operating regions, and the Schottky regions are in the active region and are formed in a striped pattern, and
the second second-conductivity-type region is connected to ohmic regions and the non-operating regions in the termination region.

* * * * *